(12) United States Patent
Cai et al.

(10) Patent No.: US 8,703,557 B1
(45) Date of Patent: Apr. 22, 2014

(54) METHODS OF REMOVING DUMMY FIN STRUCTURES WHEN FORMING FINFET DEVICES

(71) Applicants: GLOBALFOUNDRIES Inc., Grand Cayman (KY); International Business Machines Corporation, Armonk, NY (US)

(72) Inventors: Xiuyu Cai, Niskayuna, NY (US); Ruilong Xie, Niskayuna, NY (US); Kangguo Cheng, Schenectady, NY (US); Ali Khakifirooz, Mountain View, CA (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/863,044

(22) Filed: Apr. 15, 2013

(51) Int. Cl.
*H01L 21/84* (2006.01)
*H01L 21/00* (2006.01)

(52) U.S. Cl.
USPC ........... 438/157; 438/156; 438/158; 438/159; 438/164; 438/595; 257/347; 257/354; 257/E21.19

(58) Field of Classification Search
None
See application file for complete search history.

(56) References Cited

U.S. PATENT DOCUMENTS

| 7,187,046 B2* | 3/2007 | Wu et al. | 257/412 |
| 7,323,375 B2* | 1/2008 | Yoon et al. | 438/164 |
| 7,629,651 B2* | 12/2009 | Nakajima | 257/347 |
| 2013/0224945 A1* | 8/2013 | Liu et al. | 438/595 |

* cited by examiner

*Primary Examiner* — Zandra Smith
*Assistant Examiner* — Khanh Duong
(74) *Attorney, Agent, or Firm* — Amerson Law Firm, PLLC

(57) ABSTRACT

One method disclosed herein includes forming a plurality of fin-formation trenches in a substrate that defines a plurality of fins, wherein at least one of the fins is a dummy fin, forming an insulating material that fills at least a portion of the trenches, forming a recess in a masking layer formed above the insulating material, forming a sidewall spacer on sidewalls of the recess so as to define a spacer opening, performing at least one first etching process on the masking layer through the spacer opening to define an opening in the masking layer that exposes a portion of the insulating material and the dummy fin, and performing at least one second etching process to remove at least a portion of the dummy fin and thereby define an opening in the insulating material.

23 Claims, 20 Drawing Sheets

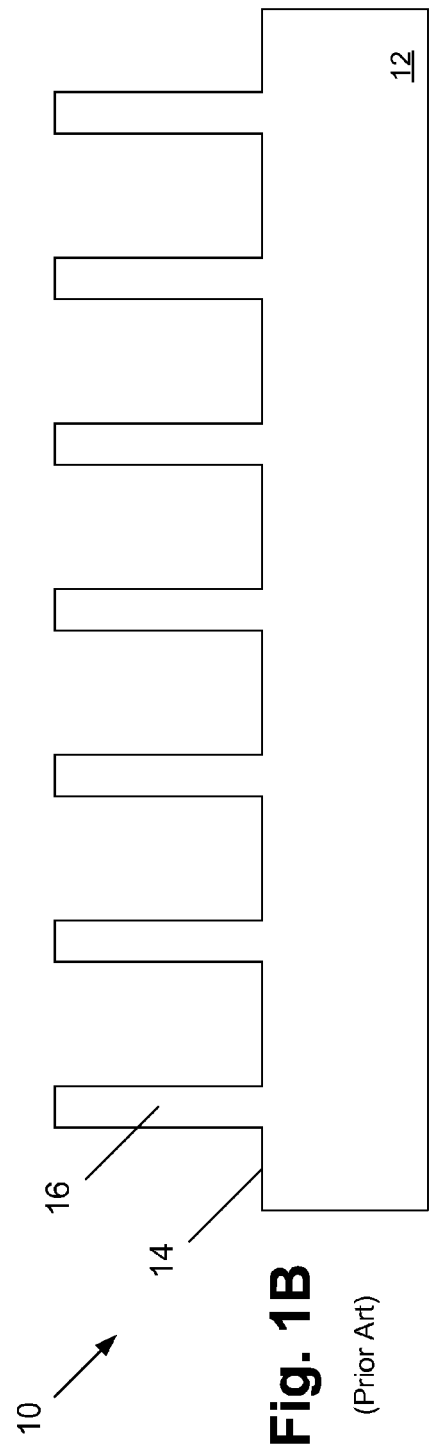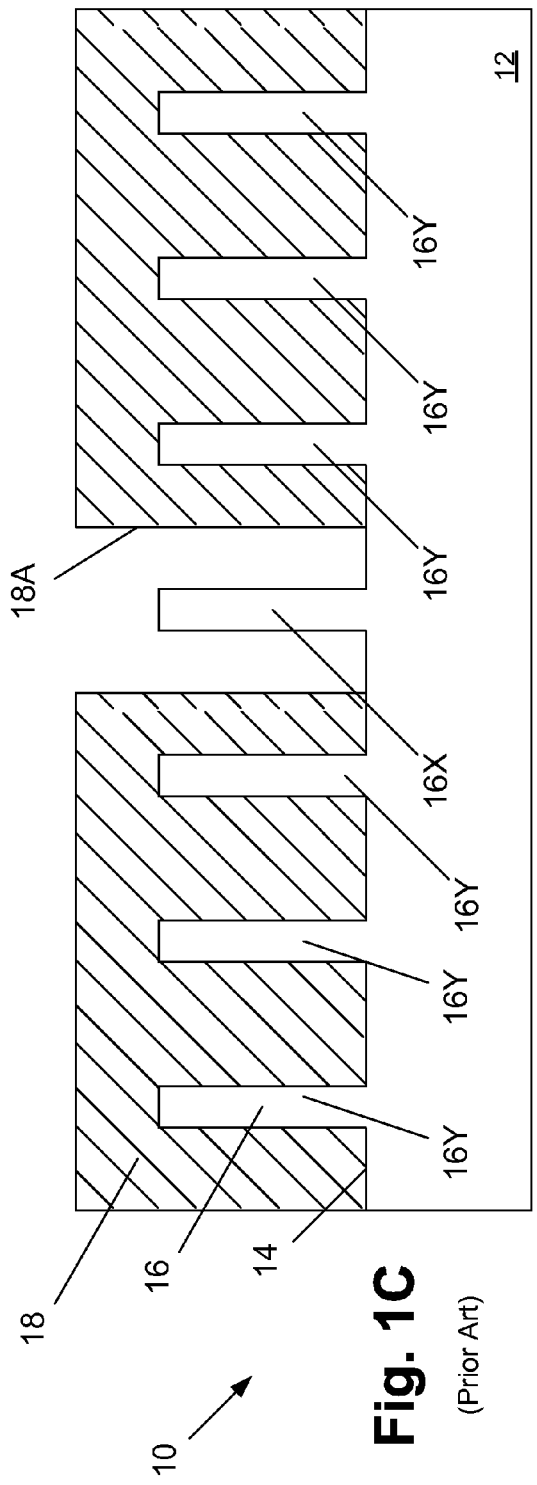
Fig. 1B (Prior Art)
Fig. 1C (Prior Art)

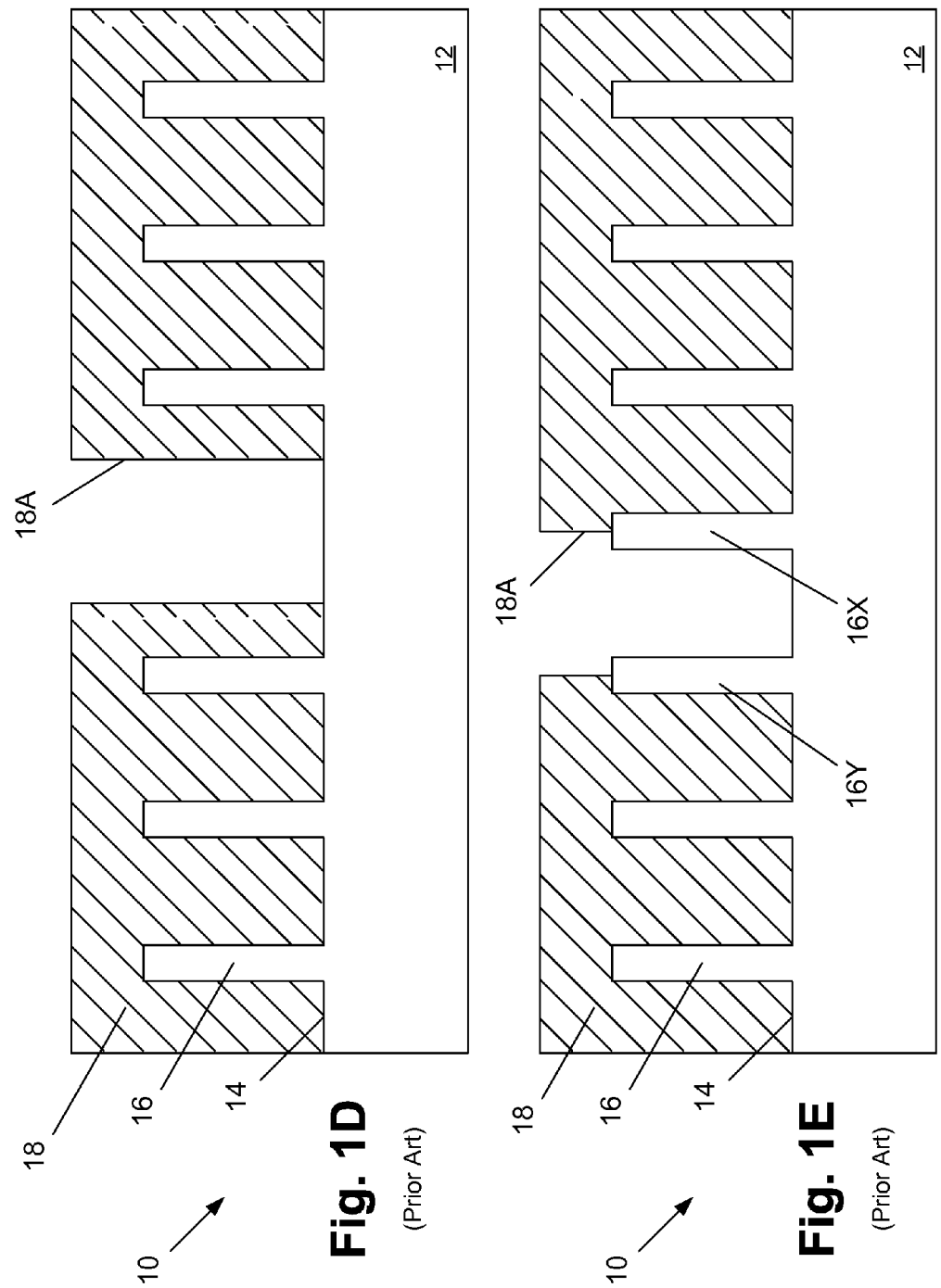

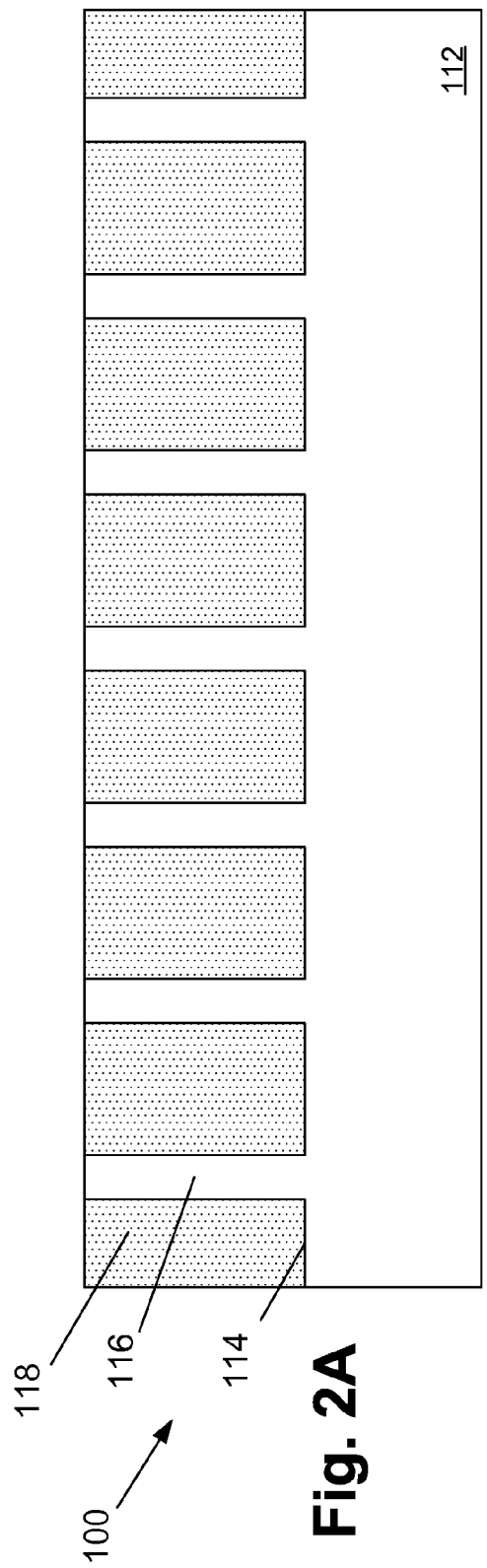

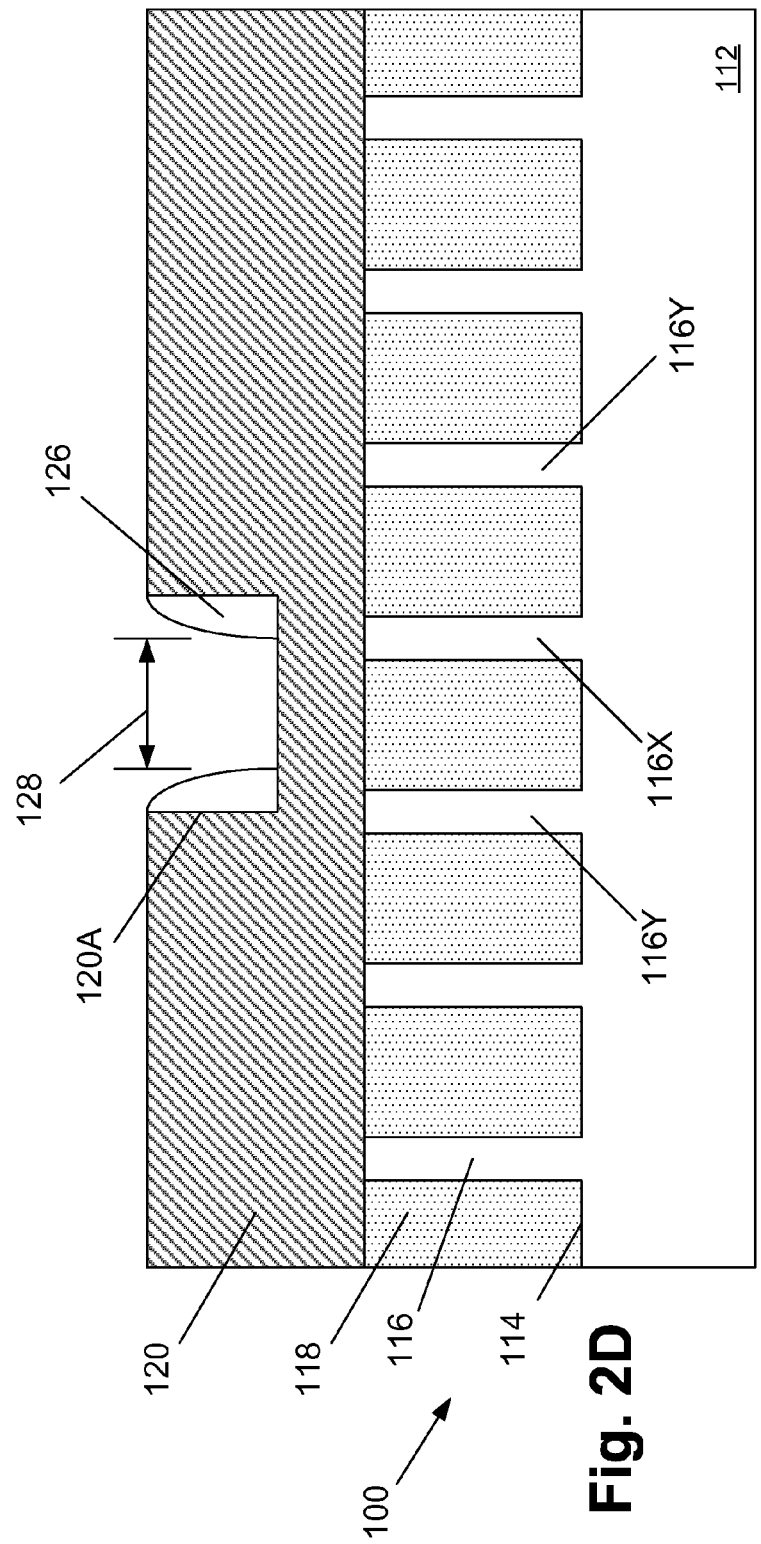

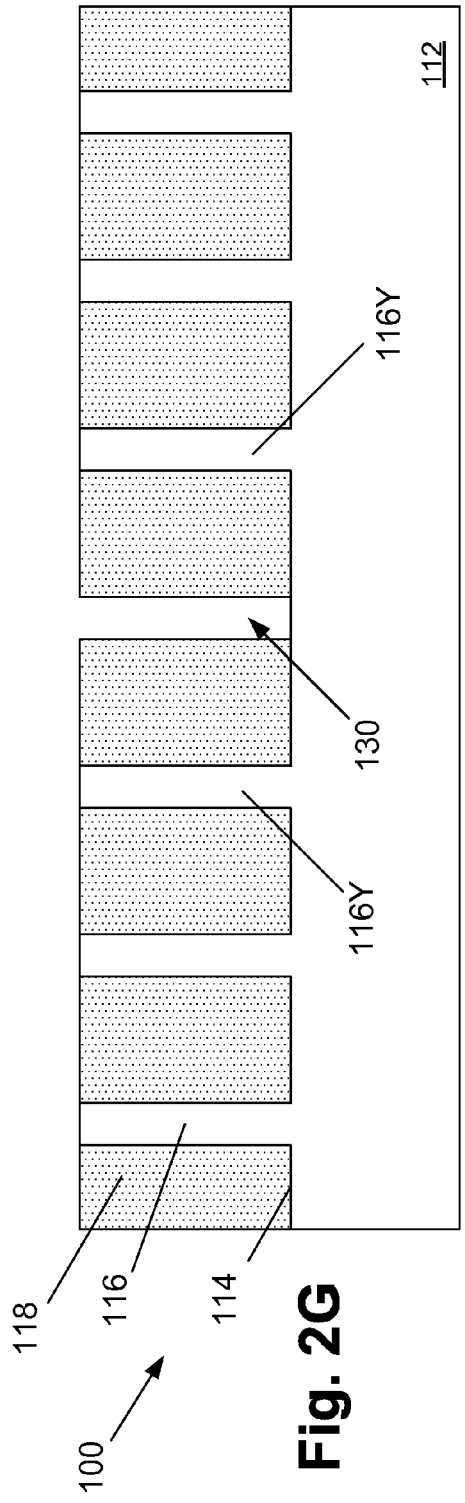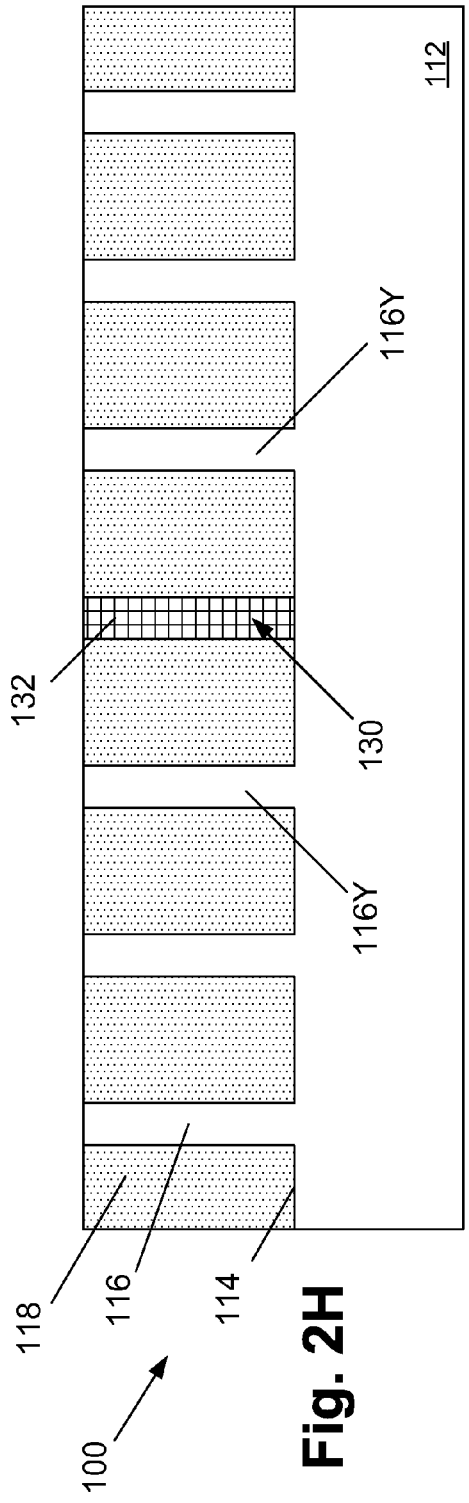

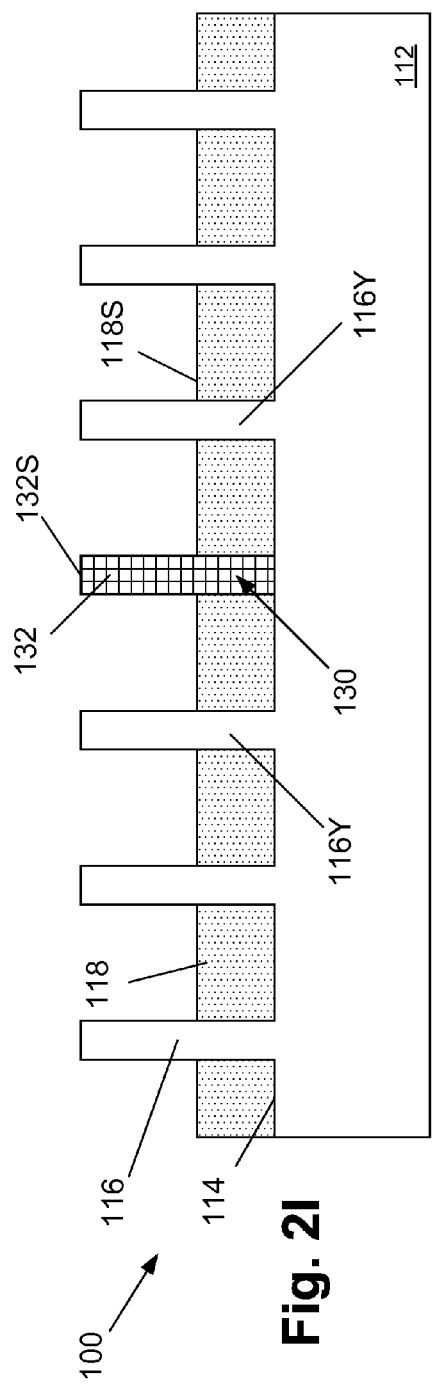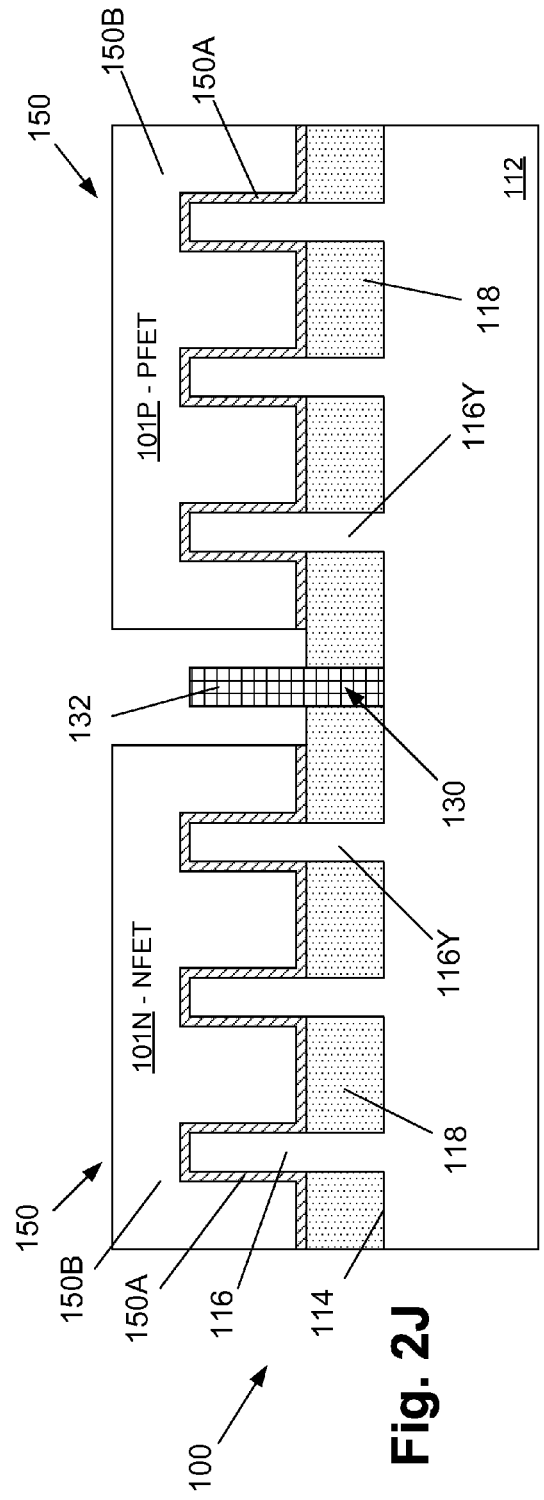

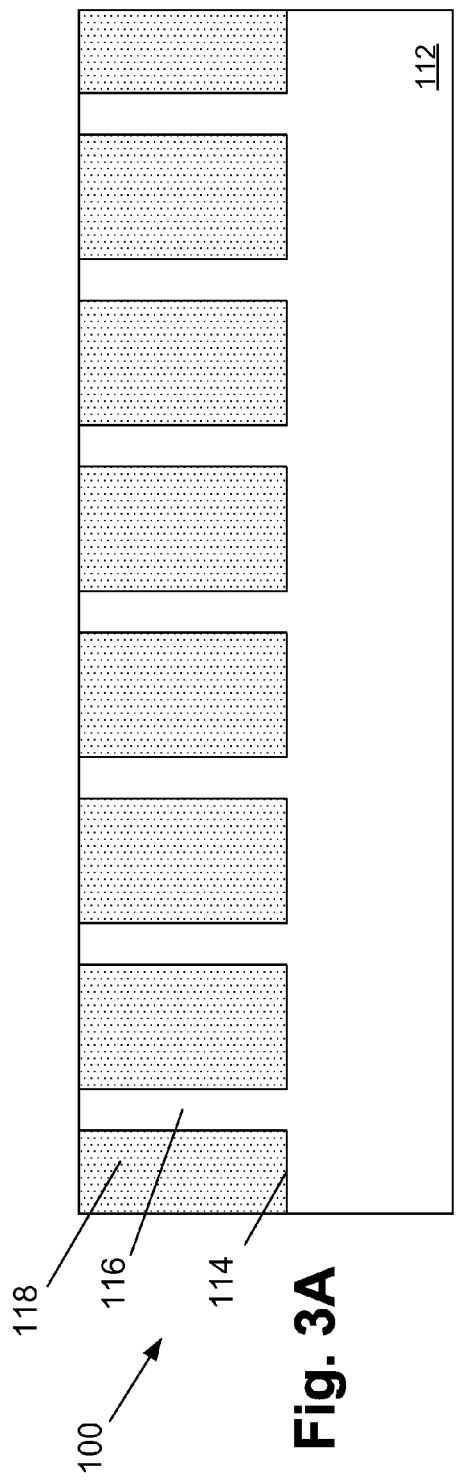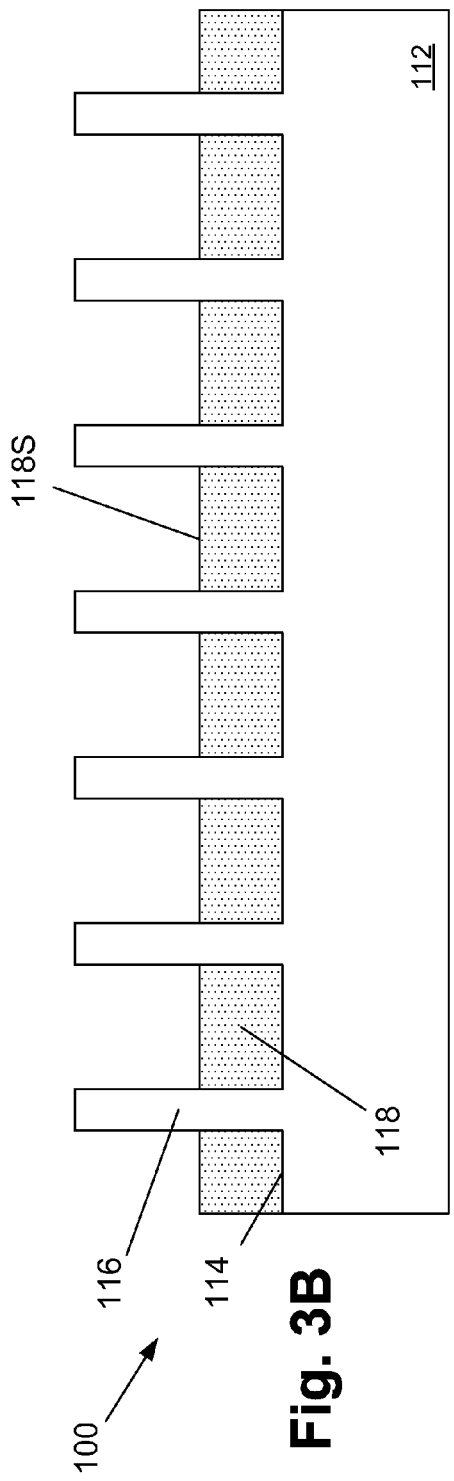

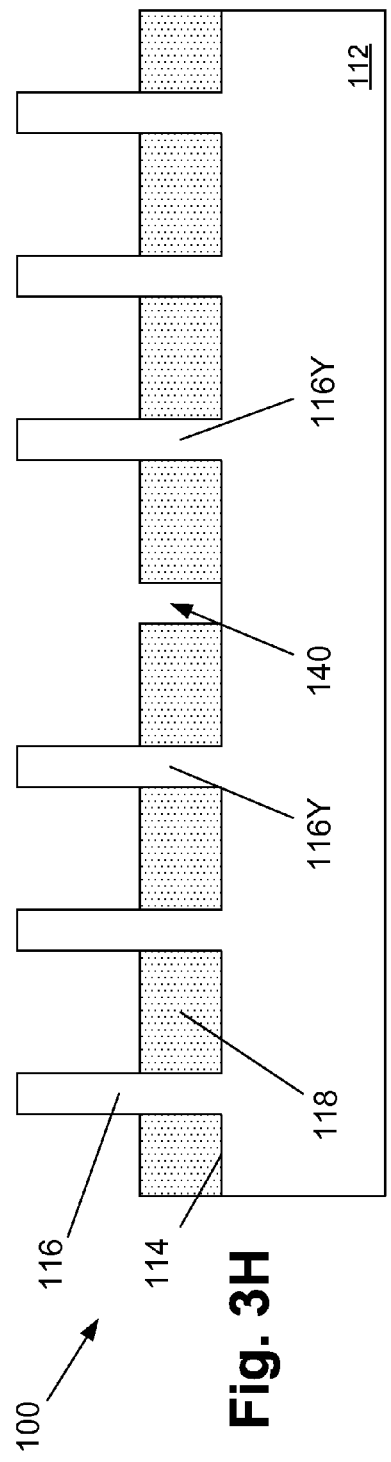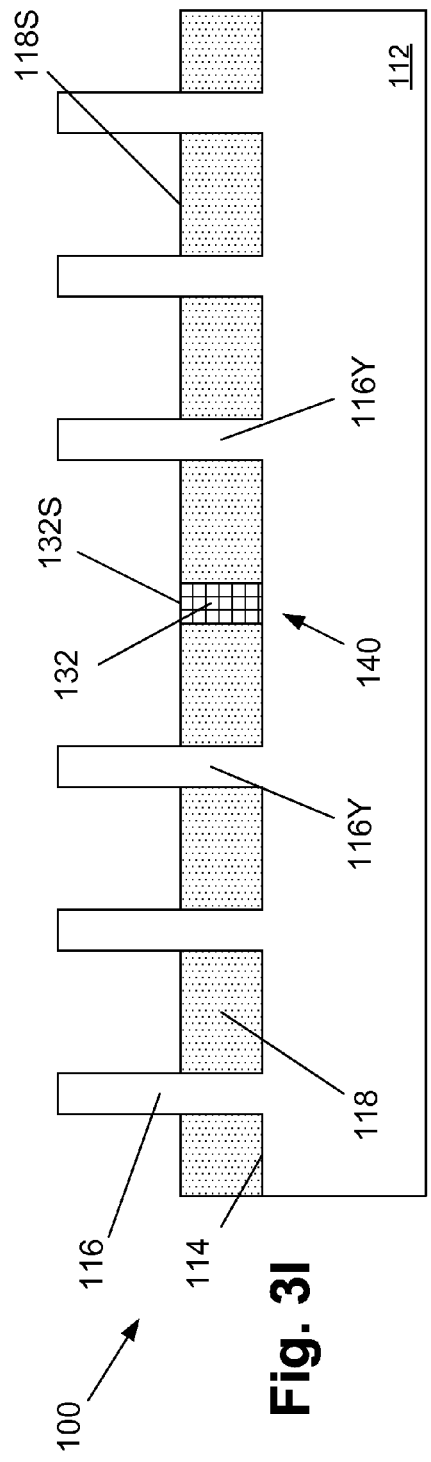

METHODS OF REMOVING DUMMY FIN STRUCTURES WHEN FORMING FINFET DEVICES

BACKGROUND OF THE INVENTION

1. Field of the Invention

Generally, the present disclosure relates to the manufacture of semiconductor devices, and, more specifically, to various methods of removing dummy fin structures when forming FinFET devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If there is no voltage applied to the gate electrode, then there is no current flow through the device (ignoring undesirable leakage currents, which are relatively small). However, when an appropriate voltage is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1a is a perspective view of a reference FinFET semiconductor device "A" that is formed above a semiconductor substrate "B." The device A includes a plurality of fins "C," a gate electrode "D," sidewall spacers "E" and a gate cap layer "F." The drawings discussed herein are cross-sectional views taken through the gate electrode D in a direction that is parallel to the long axis of the gate electrode D, i.e., in the gate width direction, indicated by the line "X-X". In a conventional process flow, the portions of the fins C that are positioned in the source/drain regions may be increased in size or even merged together (not shown in FIG. 1A) by performing one or more epitaxial growth processes. It should be understood that FIG. 1A is only provided to show the location of various cross-sectional views that may be depicted in the drawings below.

In a FinFET device, the gate electrode D encloses both sides and an upper surface of the fins C to form a tri-gate structure so as to use a channel having a three-dimensional structure instead of a planar structure. In some cases, an insulating cap layer, e.g., silicon nitride, is positioned at the top of the fins C, and the FinFET device A only has a dual-gate structure. Unlike a planar FET, in a FinFET device, a channel is formed perpendicular to a surface of the semiconducting substrate B so as to reduce the physical size of the semiconductor device. Also, in a FinFET, the junction capacitance at the drain region of the device is greatly reduced, which tends to reduce at least some short channel effects. When an appropriate voltage is applied to the gate electrode D of the FinFET device A, the surfaces (and the inner portion near the surface) of the fins C, i.e., the substantially vertically oriented sidewalls and the top upper surface of the fins C with inversion carriers, contributes to current conduction. In a FinFET device, the "channel-width" is approximately two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive currents than planar transistor devices. Additionally, the leakage current of FinFET devices after the device is turned "OFF" is significantly reduced as compared to the leakage current of planar FETs due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

One process flow that is typically performed to form FinFET devices involves forming a plurality of trenches in the substrate to define the areas where STI regions will be formed and to define the initial structure of the fins. These trenches are typically formed in the substrate during the same process operation for processing simplicity. The trenches have a target depth that is sufficient for the needed fin height and deep enough to allow formation of an effective STI region. After the trenches are formed, a layer of insulating material, such as silicon dioxide, is formed so as to overfill the trenches. Thereafter, a chemical mechanical polishing (CMP) process is then performed to planarize the upper surface of the insulating material with the top of the fins (or the top of a patterned hard mask). Thereafter, an etch-back process is performed to recess the layer of insulating material between the fins and thereby expose the upper portions of the fins, which corresponds to the final fin height of the fins.

As FinFET devices have been scaled to meet ever increasing performance and size requirements, the width of the fins has become very small, e.g., 6-12 nm, and the fin pitch has also been significantly decreased, e.g., the fin pitch may be on the order of about 30-60 nm. Traditionally, isolation structures were always the first structure that was formed when manufacturing semiconductor devices. The isolation structures were formed by etching the trenches for the isolation structures and thereafter filling the trenches with the desired insulating material, e.g., silicon dioxide. After the isolation structures were formed, various process operations were performed to manufacture the semiconductor device. In the case of a FinFET device, this involved masking the previously formed isolation structure and etching the trenches in the substrate that defined the fins.

However, as the dimensions of the fins C became smaller, problems arose with manufacturing the isolation structures before the fins C were formed. As one example, trying to accurately define very small fins C in regions that were separated by relatively large isolation regions was difficult due to the non-uniform spacing between various structures on the substrate B. One manufacturing technique that is employed in manufacturing FinFET devices is to initially form a so-called "sea-of-fins" across the substrate B, and thereafter remove some of the fins where larger isolation structures will be formed. The fins that are to be removed in such a process are sometimes referred to as "dummy fins" as they are not intended to be part of the final FinFET devices that are formed on the substrate B.

FIGS. 1B-1F depict one illustrative prior art method of removing dummy fin structures when forming FinFET devices. FIG. 1B depicts an illustrative FinFET device 10 that is at the point of fabrication where the "sea-of-fins" 16 has been initially formed in the substrate 12. The plurality of fins 16 are formed by performing one or more etching processes through a patterned mask layer (not shown) to define a plurality of fin-forming trenches 14 in the substrate 12. Using this "sea-of-fins" type manufacturing approach, better accuracy and repeatability may be achieved in forming the fins 16 to very small dimensions due to the more uniform environment in which the etching process that forms the fin-forming trenches 14 is performed. In the example depicted in FIGS. 1B-1F, the fins 16 all have a single uniform spacing. However, in a real-world device, the fins 16 may be formed so as to have various regions with different spacing or fin pitches.

After the "sea-of-fins" has been formed, some of the fins 16, i.e., the dummy fins, must be removed to create room for or define the spaces where isolation regions will ultimately be formed. FIG. 1C depicts the device 10 after several process operations have been formed. Initially, a patterned mask layer 18, e.g., a patterned photoresist mask, is formed above the substrate 10. In the depicted example, the mask layer 18 has an opening 18A that is formed so to expose an illustrative dummy fin 16X for removal, while masking the device fins 16Y that will be part of the final device 10. In the depicted example, only a single fin will be removed to make room for the isolation region. However, as will be recognized by those skilled in the art, depending upon the desired final size of the isolation region, more than one fin 16 may be removed. In the example depicted in FIGS. 1C-1D, the opening 18A is precisely aligned over the dummy fin 16X that is to be removed. FIG. 1D depicts the device 10 after a timed etching process has been performed to remove the dummy fin 16X. Any etching of the substrate 12 during the dummy fin etch process is not depicted in FIG. 1D.

In some cases, with very tight fin pitches, the lithography and etching processes that are performed to remove the dummy fins 16X can result in undesirable damage to the device fins 16Y, the fins that are intended for final use in the device 10. In contrast to the idealized situation depicted in FIGS. 1C-1D, FIGS. 1E-1F depict an example where the opening 18A in the patterned mask layer 18 is somewhat misaligned. Such misalignment may occur for a variety of reasons, e.g., variations on photolithography tools, materials and techniques, overlay errors, etc. In the example depicted in FIGS. 1E-1F, the opening 18A in the misaligned patterned mask layer 18 exposes a portion of a device fin 16Y as well as a portion of the illustrative dummy fin 16X. FIG. 1F depicts an example of where an anisotropic etching process was performed through the misaligned patterned masking layer 18. In this situation, due to the misaligned patterned masking layer 18, the anisotropic etching process undesirably removes a portion of the device fin 16Y and it results in the removal of only a portion of the dummy fin 16X. Failure to remove all of the dummy fins that are intended to be removed may result in isolation regions being less effective at performing their important electrical isolation function. Removal of all or portions of device fins that are intended to be included in the final integrated circuit product can result in reduced device performance and perhaps failure.

The present disclosure is directed to various methods of removing dummy fin structures when forming FinFET devices that may solve or reduce the impact of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of removing dummy fin structures when forming FinFET devices. In one example, the method disclosed herein includes forming a plurality of fin-formation trenches in a semiconductor substrate, wherein the fin-formation trenches define a plurality of spaced-apart fins and wherein at least one of the fins is a dummy fin, forming a layer of insulating material that fills at least a portion of the fin-formation trenches, forming a masking layer above the layer of insulating material, forming a recess in the masking layer, wherein the recess has a depth that is less than a thickness of the masking layer, forming a sidewall spacer on sidewalls of the recess in the masking layer, wherein the sidewall spacer defines a spacer opening, performing at least one first etching process on the masking layer through the spacer opening to define an opening in the masking layer that exposes a portion of the layer of insulating material and at least a portion of the dummy fin, and performing at least one second etching process to remove at least a portion of the dummy fin and thereby define an opening in the layer of insulating material.

Another illustrative method disclosed herein includes forming a plurality of fin-formation trenches in a semiconductor substrate, wherein the fin-formation trenches define a plurality of spaced-apart fins that are comprised of a plurality of device fins and at least one dummy fin, forming a layer of insulating material that fills the fin-formation trenches, wherein the layer of insulating material has an upper surface that is substantially planar with an upper surface of each of the plurality of spaced-apart fins, forming a masking layer above the layer of insulating material and the upper surfaces of the plurality of spaced-apart fins, forming a recess in the masking layer, wherein the recess has a depth that is less than a thickness of the masking layer, forming a sidewall spacer on sidewalls of the recess in the masking layer that defines a spacer opening, performing at least one first etching process on the masking layer through the spacer opening to define an opening in the masking layer that exposes a portion of the layer of insulating material and at least a portion of the at least one dummy fin, performing at least one second etching process to remove at least a portion of the at least one dummy fin and thereby define an opening in the layer of insulating material, removing the masking layer, forming a replacement material in the opening in the layer of insulating material, and performing at least one process operation to recess the upper surface of the layer of insulating material to a desired recessed level so as to thereby expose a portion of the plurality of device fins and a portion of the replacement material.

Yet another illustrative method disclosed herein includes forming a plurality of fin-formation trenches in a semiconductor substrate, wherein the fin-formation trenches define a plurality of spaced-apart fins that include a plurality of device fins and at least one dummy fin, forming a layer of insulating material that fills less than an entire depth of the fin-formation trenches, wherein the layer of insulating material has an upper surface that is below an upper surface of each of the plurality of spaced-apart fins, forming a masking layer above the layer of insulating material and the upper surfaces of the plurality of spaced-apart fins, wherein portions of the masking layer are positioned within the fin-formation trenches, forming a recess in the masking layer, wherein the recess has a depth that is less than a thickness of the masking layer, forming a sidewall spacer on sidewalls of the recess in the masking layer so as to define a spacer opening, performing at least one first etching process on the masking layer through the spacer opening to define an opening in the masking layer that exposes a portion of the layer of insulating material and at least a portion of the at least one dummy fin, performing at least one second etching process to remove at least a portion of the at least one dummy fin and thereby define an opening in the layer of insulating material, removing the masking layer, and forming a replacement material in the opening in the layer of insulating material.

BRIEF DESCRIPTION OF THE DRAWINGS

The disclosure may be understood by reference to the following description taken in conjunction with the accompanying drawings, in which like reference numerals identify like elements, and in which:

FIGS. 1A-1F depict one illustrative prior art FinFET device and a method of removing dummy fin structures when forming FinFET devices;

FIGS. 2A-2J depict one illustrative method disclosed herein for removing dummy fin structures when forming FinFET devices; and FIGS. 3A-3J depict another illustrative method disclosed herein for removing dummy fin structures when forming FinFET devices.

Figure 1A:
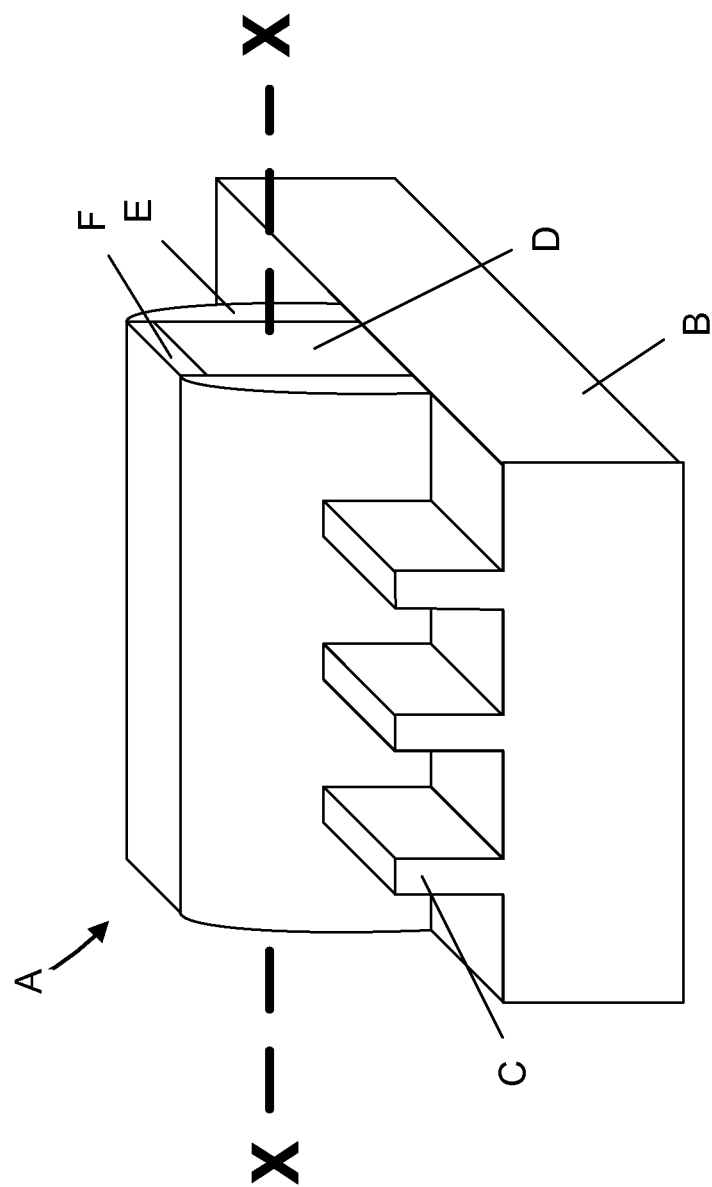
Figure 1F:
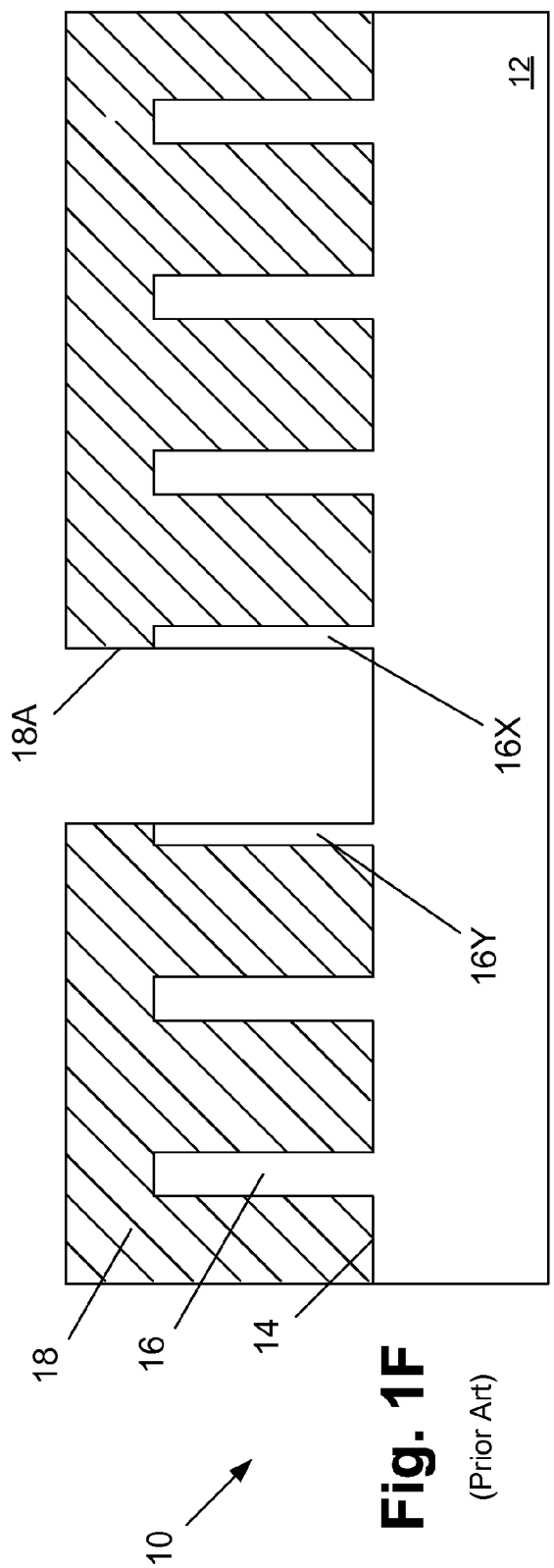

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present disclosure is directed to various methods of removing dummy fin structures when forming FinFET devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type and/or P-type FinFET devices. With reference to the attached figures, various illustrative embodiments of the methods and devices disclosed herein will now be described in more detail.

Figure 2B:
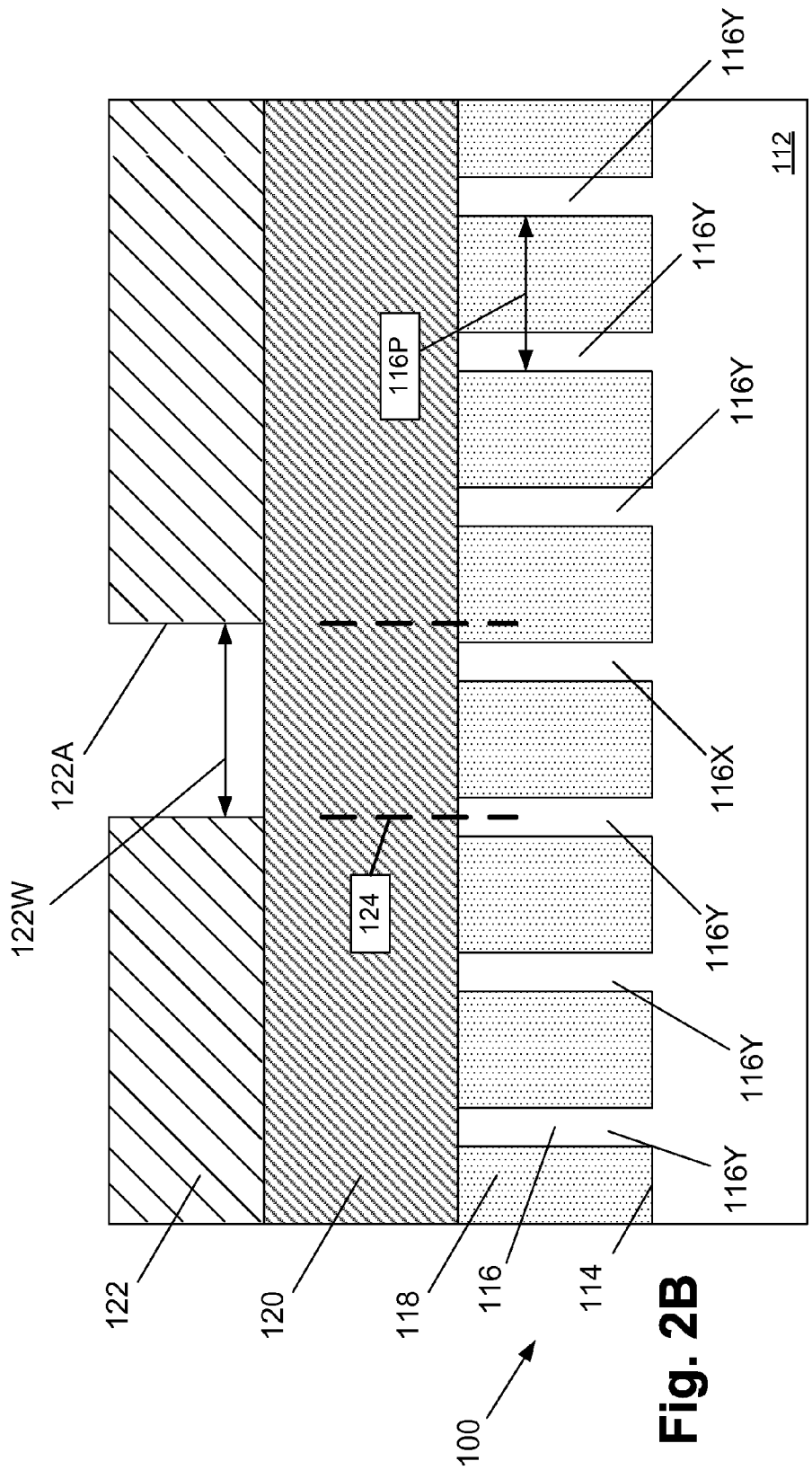

FIGS. 2A-2J depict one illustrative method disclosed herein for removing dummy fin structures when forming FinFET devices. FIG. 2A schematically depicts the novel integrated circuit product 100 at a point in fabrication wherein several process operations have been performed. First, a plurality of fin-formation trenches 114 were formed in a semiconductor substrate 112 by performing at least one etching process through a patterned hard mask layer (not shown), e.g., a patterned layer of silicon nitride. The etching process results in the formation of a plurality of spaced-apart fins 116. Thereafter, the patterned masking layer was removed and a layer of insulating material 118 was deposited on the substrate 112 so as to over-fill the fin-formation trenches 114. Then, a chemical mechanical polishing (CMP) process was performed so as to planarize the upper surface of the layer of insulating material 118 with the upper surface of the fins 116. In the depicted example, the spacing between the fins 116 is depicted as being substantially uniform although that may not be required to practice at least some aspects of the various inventions disclosed herein.

The substrate 112 may have a variety of configurations, such as a bulk substrate configuration, or it may be the active layer of a silicon-on-insulator (SOI) substrate. The substrate 112 may be made of silicon or it may be made of materials other than silicon. Thus, the terms "substrate" or "semiconductor substrate" should be understood to cover all semiconducting materials and all forms of such materials. Additionally, the overall size, shape and configuration of the fin-formation trenches 114 and the fins 116 may vary depending on the particular application. In one illustrative embodiment, based on current-day technology, the depth of the fin-formation trenches 114 may range from approximately 30-200 nm and the width of the fin-formation trenches 114 may range from about 20-50 nm. In some embodiments, the fins 116 may have a width within the range of about 5-30 nm and a height that corresponds to the depth of the fin-formation trenches 114. In the illustrative examples depicted in the attached drawings, the fin-formation trenches 114 and fins 116 are all depicted as having a uniform size and shape. However, as discussed more fully below, such uniformity in the size and shape of the fin-formation trenches 114 and the fins 116 is not required to practice at least some aspects of the inventions disclosed herein. In the attached figures, the fin-formation trenches 114 are depicted as having been formed by performing an anisotropic etching process that results in the fin-formation trenches 114 having a schematically depicted, generally rectangular configuration. In an actual real-world device, the sidewalls of the fin-formation trenches 114 may be somewhat inwardly tapered and the fins may have a tapered cross-sectional configuration, although that configuration is not depicted in the attached drawings. In some cases, the fin-formation trenches 114 may have a reentrant profile (not shown) near the bottom of the fin-formation trenches 114. To the extent the fin-formation trenches 114 are formed by performing a wet etching process, the fin-formation trenches 114 may tend to have a more rounded configuration or non-linear configuration as compared to the generally rectangular configuration of the fin-formation trenches 114 that are formed by performing an anisotropic etching process. Thus, the size and configuration of the fin-formation trenches 114, and the manner in which they are made, as well as the general cross-sectional configuration of the fins 116, should not be considered a limitation of the presently disclosed inventions. For ease of disclosure, only the substantially rectangular fin-formation trenches 114 and substantially rectangular shaped fins 116 will be depicted in the subsequent drawings. The layer of insulating material 118 may be comprised of a variety of different materials, such as silicon dioxide, doped silicon dioxide (doped with carbon, boron or phosphorous), etc., and it may be initially formed by performing a variety of techniques, e.g., chemical vapor deposition (CVD), etc.

FIG. 2B schematically depicts the novel integrated circuit product 100 at a point in fabrication wherein several process operations have been performed. At this point, the device 100 is comprised of an illustrative dummy fin 116X that has been identified for removal and a plurality of device fins 116Y that will be part of the final device 100. In the depicted example, only a single fin 116X will be removed. However, as will be recognized by those skilled in the art after a complete reading of the present application, the novel methods disclosed herein may be employed to remove any desired number of dummy fins 116X. Also depicted in FIG. 2A is an illustrative hard mask layer 120 and a patterned etch mask 122. The patterned etch mask 122 has an opening 122A with a width 122W. In the depicted example, the opening 122A in the patterned etch mask 122 is misaligned relative to the dummy fin 116X to be removed, as depicted by the dashed lines 124. That is, as positioned on the device 100, if an etching process were performed through the patterned etch mask 122, a portion of one of the device fins 116Y would also be removed.

The additional layers of material depicted in FIG. 2B may be formed from a variety of different materials and they may be formed by performing a variety of known techniques. For example, the hard mask layer 120 may be comprised of a variety of materials, such as, for example, silicon nitride, silicon oxynitride, hafnium oxide, etc. Moreover, the hard mask layer 120 may be comprised of multiple layers of material. Thus, the particular form and composition of the hard mask layer 120, and the manner in which it is made, should not be considered a limitation of the present invention. The thickness of the hard mask layer 120 may also vary depending upon the particular application, e.g., 5-50 nm, and it may be formed above the substrate 112 by performing known deposition techniques, e.g., chemical vapor deposition (CVD) processes, atomic layer deposition (ALD) processes, etc. The patterned etch mask 122 may be comprised of a layer of photoresist material and it may be formed using traditional photolithography tools and techniques. The width 122W of the opening 122A may vary depending upon the particular application (e.g., 20-1000 nm) and factors such as the pitch 116P of the fins 116. In one illustrative embodiment, the width 122W may be equal to approximately the fin pitch 116P.

Figure 2C:
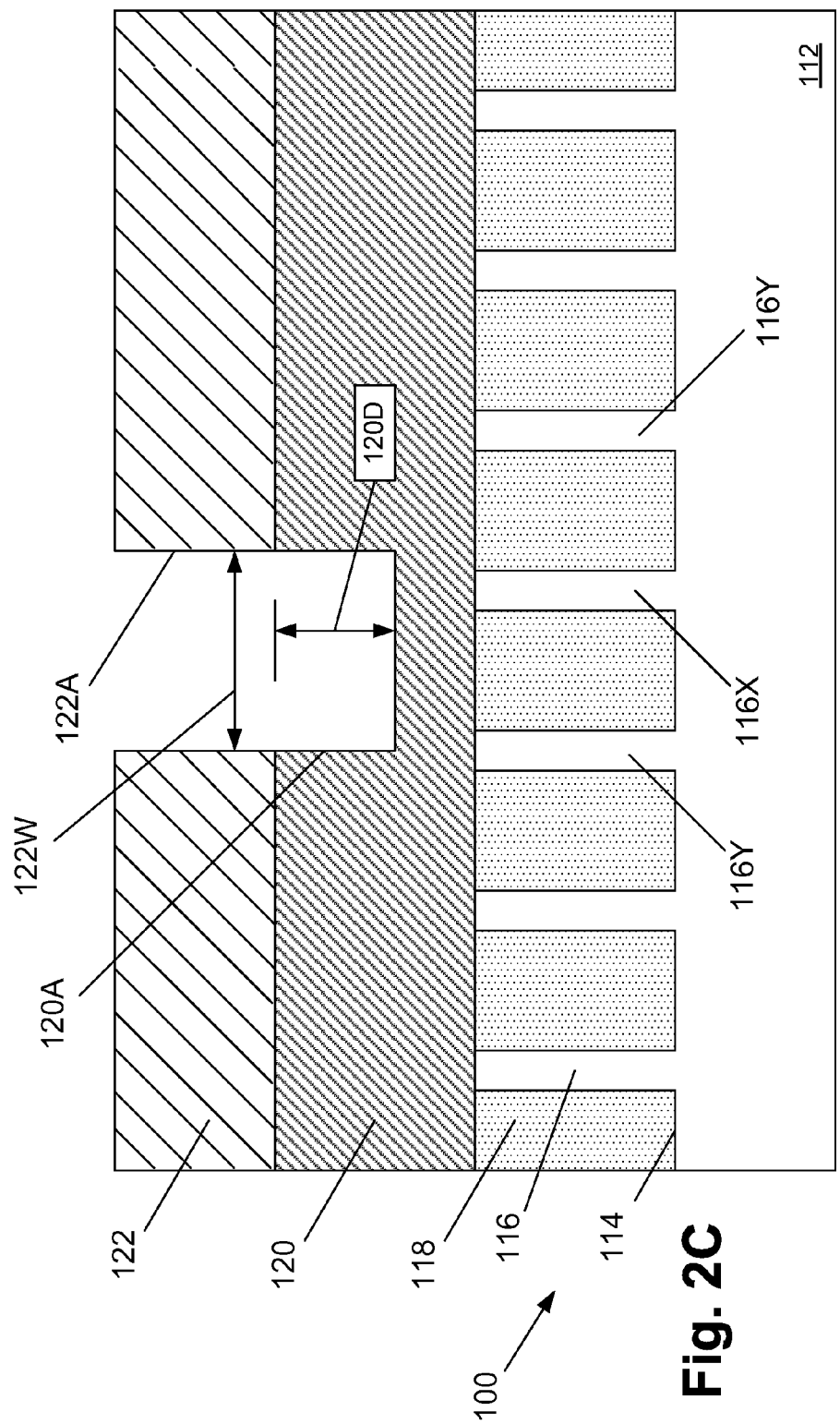

FIG. 2C depicts the product 100 after a timed anisotropic etching process was performed through the opening 122A in the patterned etch mask 122 to define a recess 120A in the hard mask layer 120. The depth 120D of the recess 120A is less than the overall thickness of the hard mask layer 120. The depth 120D may vary depending upon the particular application. In one example, the depth 120D may be about 90 percent of the overall thickness of the hard mask layer 120.

FIG. 2D depicts the device 100 after the patterned etch mask 122 has been removed and after an internal sidewall spacer 126 has been formed in the recess 120A. The spacer 126 defines a spacer opening 128, the width of which may vary depending upon the particular application. In general, the spacer 126 should have a sufficient base width such that it covers the underlying device fin 116Y that would otherwise be etched if an etching process were to be performed through an opening corresponding in size to the width of the recess 120A. For example, depending upon the particular application, the spacer 126 may have a width at its base that falls within a range of about 3-15 nm, depending upon the overlay error, fin CD variation and fin width. The spacer 126 may be formed by performing a conformal deposition process to form a layer of spacer material across the hard mask layer 120 and in the recess 120A and thereafter performing an anisotropic etching process on the layer of spacer material. In one embodiment, the spacer 126 should be made of a material that exhibits a high degree of etch selectivity relative to the hard mask layer 120, the fins 116 and the layer of insulating material 118. Potential candidate materials for the spacer 126 include, but are not limited to, silicon nitride, silicon carbon nitride, silicon boron nitride, a doped nitride, silicon oxynitride, etc., depending upon the surrounding materials.

Figure 2E:
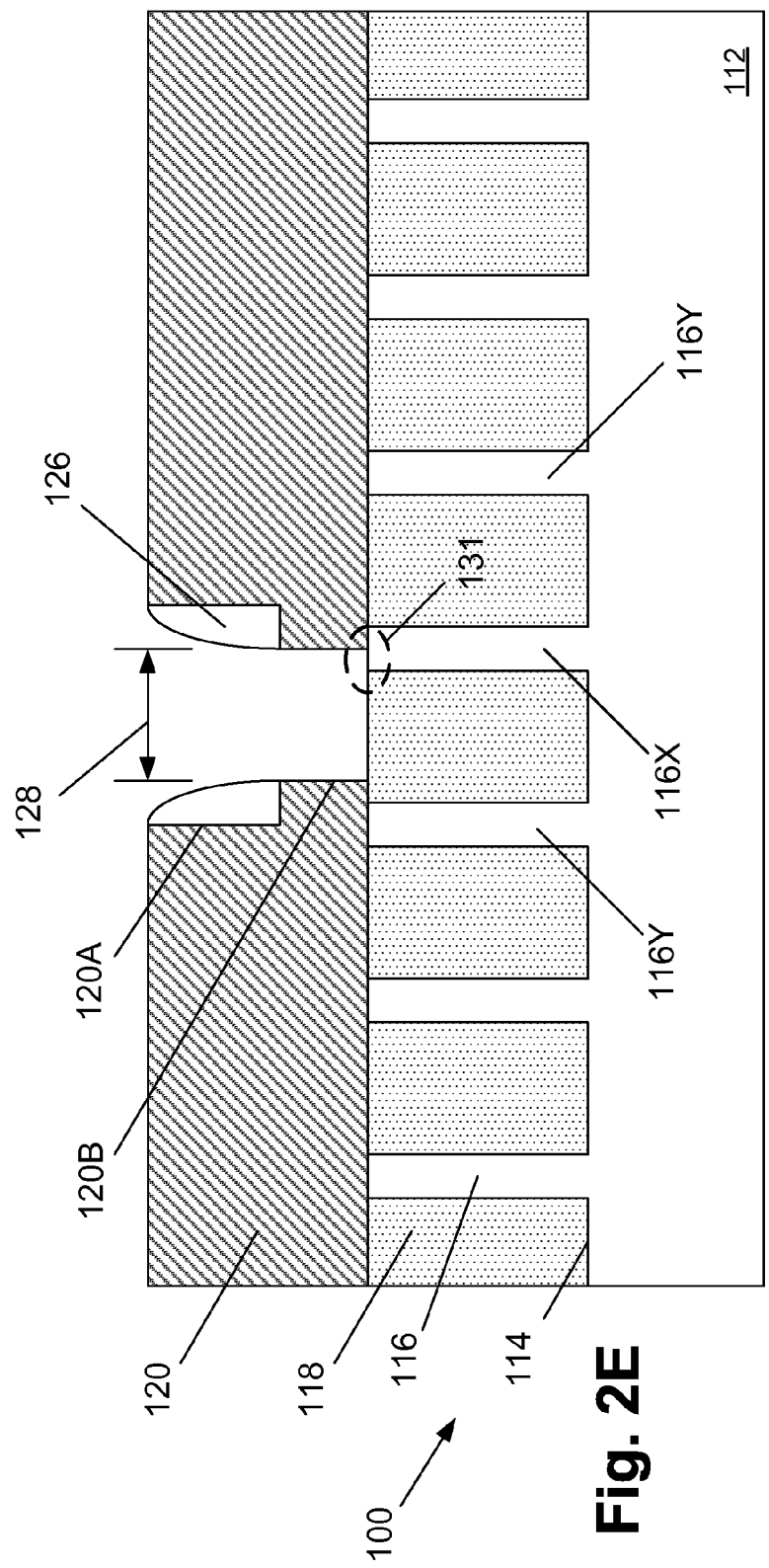

FIG. 2E depicts the product 100 after an etching process, such as an anisotropic etching process, has been performed on the hard mask layer 120 through the spacer opening 128 defined by the spacer 126. This etching process results in the definition of a reduced size opening 120B in the hard mask layer 120 that is smaller than the width of the recess 120A. The reduced size opening 120B exposes a portion of the layer of insulating material 118 and at least a portion of the dummy fin 116X, as indicated in the dashed region 131, for further processing.

Figure 2F:
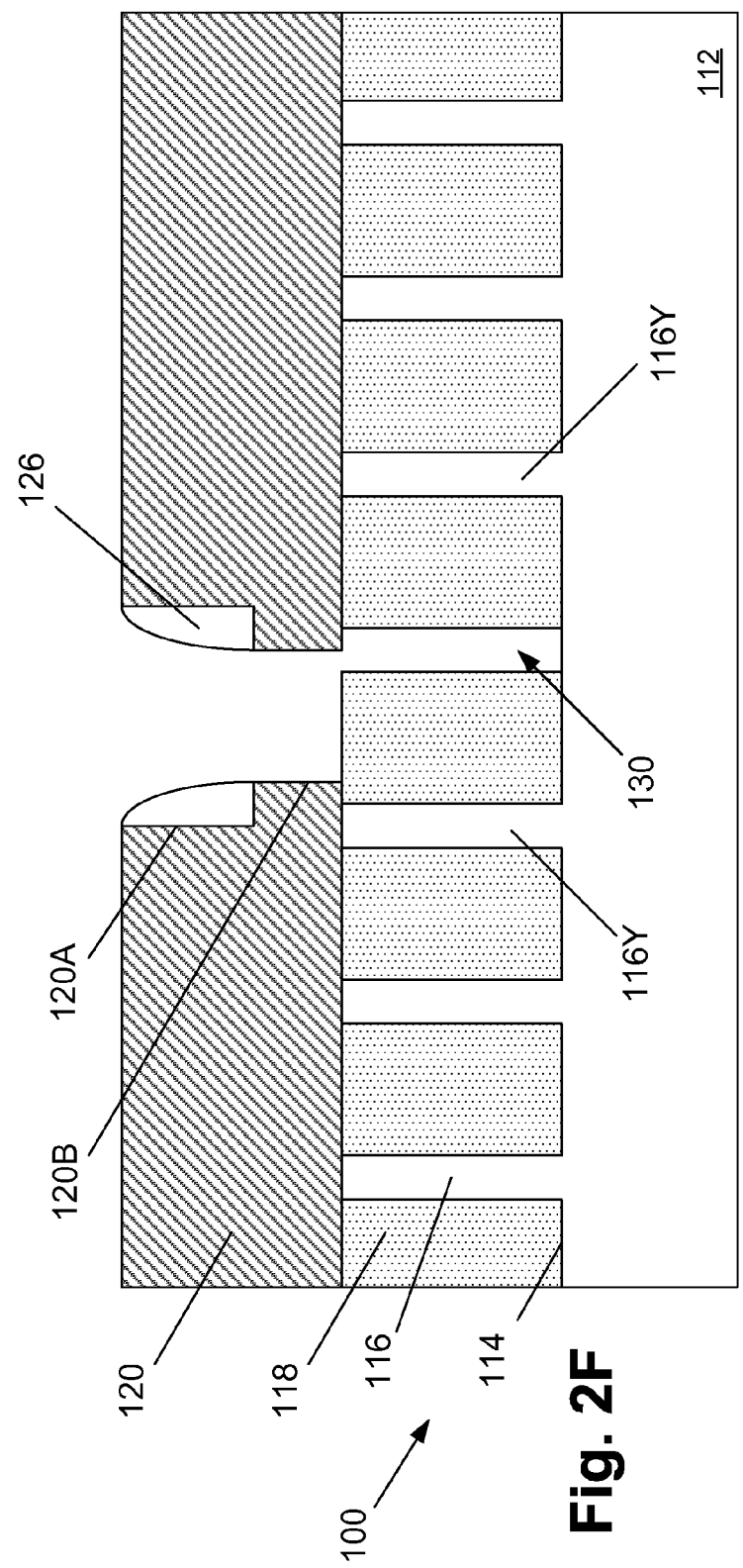

FIG. 2F depicts the product 100 after an etching process, such as a timed, isotropic etching process, has been performed through the reduced size opening 120B in the hard mask layer 120 on the exposed portion of the dummy fin 116X (FIG. 2E). This isotropic etching process effectively removes the dummy fin 116X and results in the formation of an opening or recess 130 in the layer of insulating material 118, i.e., the space formerly occupied by the removed portions of the dummy fin 116X in the layer of insulating material 118. To the extent this etching process removes any of the underlying substrate 112 positioned under the dummy fin 116X, such etching of the substrate is not depicted in the attached drawings.

FIG. 2G depicts the product 100 after the patterned hard mask layer 120 and the spacers 126 have been removed from the device 100. These materials may be removed by performing one or more etching processes.

FIG. 2H depicts the product 100 after a replacement material 132 has been formed in the opening 130. The replacement material 132 may be comprised of any type of material, e.g., an insulating material, such as silicon nitride, $Al_2O_3$, etc. In one illustrative example, the replacement material 132 may be any of the insulating materials set forth above for the layer of insulating material 118. The replacement material 132 may be formed by depositing a layer of the desired material above the device 100 so as to over-fill the opening 130. Thereafter, a CMP process may be performed to remove excess material positioned outside of the opening 130 to thereby result in the replacement material 132 depicted in FIG. 2H.

FIG. 2I depicts the device 100 after a recess etching process was performed on the layer of insulating material 118 so as to recess its upper surface 118S to a desired recessed level. In the depicted example, this etching process is selective relative to the fins 116 and the replacement material 132 and thereby exposes portions of the device fins 116Y and the replacement material 132. In one illustrative example, the recessed surface 118S of the layer of insulating material 118 will effectively define the final fin height for the fins 116 in the completed devices. In this embodiment, the upper surface 132S of the replacement material 132 is positioned above the recessed surface 118S of the layer of insulating material 118.

FIG. 2J depicts the product 100 after schematically depicted final gate structures 150 have been formed for an illustrative N-type FinFET device 101N and an illustrative P-type FinFET device 101P. In the depicted example, each of the devices 101N, 101P is comprised of three illustrative fins 116, but in practice each device 101N, 101P may be comprised of any number of fins and they both need not have the same number of fins 116. In general, a final gate structure 150 is typically comprised of an illustrative gate insulation layer 150A and an illustrative gate electrode 150B. The final gate structure 150 may be formed using so-called "gate-first" or "replacement-gate" ("gate-last") techniques. An illustrative gate cap layer (not shown) may also be formed above the illustrative gate electrode 150B. The gate insulation layer 150A may be comprised of a variety of different materials, such as, for example, silicon dioxide, a so-called high-k (k greater than 10) insulation material (where k is the relative dielectric constant), etc. The thickness of the gate insulation layer 150A may also vary depending upon the particular application, e.g., it may have a thickness of about 1-2 nm. Similarly, the gate electrode 150B may also be comprised of a variety of conductive materials, such as polysilicon or amorphous silicon, or it may be comprised of one or more metal layers that act as the gate electrode 150B. Additionally workfunction adjusting metals may be formed as part of the gate electrode structure 150B in some applications. As will be recognized by those skilled in the art after a complete reading of the present application, the gate structures 150 depicted in the drawings, i.e., the gate insulation layer 150A and the gate electrode 150B, are intended to be representative in nature. That is, the gate structures 150 may be comprised of a variety of different materials and they may have a variety of configurations. Of course, depending upon the particular application, the materials of construction for the gate structure 150 of the N-type FinFET device 101N may be different than the materials of construction for the gate structure 150 of the P-type FinFET device 101P. In one illustrative embodiment, a deposition process may be performed to form the depicted gate insulation layer 150A comprised of a high-k insulating material. Thereafter, one or more metal layers (that will become the gate electrode 150B) and a gate cap layer material (not shown), e.g., silicon nitride, may be deposited above the device 100. At this point, traditional manufacturing techniques may be performed to complete the manufacture of the product 100. For example, sidewall spacers (not shown) comprised of, for example, silicon nitride, may be formed adjacent the final gate structures 150. After the spacers are formed, if desired, an epitaxial growth process may be performed to form additional semiconducting material (not shown) on the portions of the fins 116 positioned outside of the spacers. Additional contacts and metallization layers may then be formed above the FinFET devices 101N, 101P using traditional techniques.

Figure 3C:
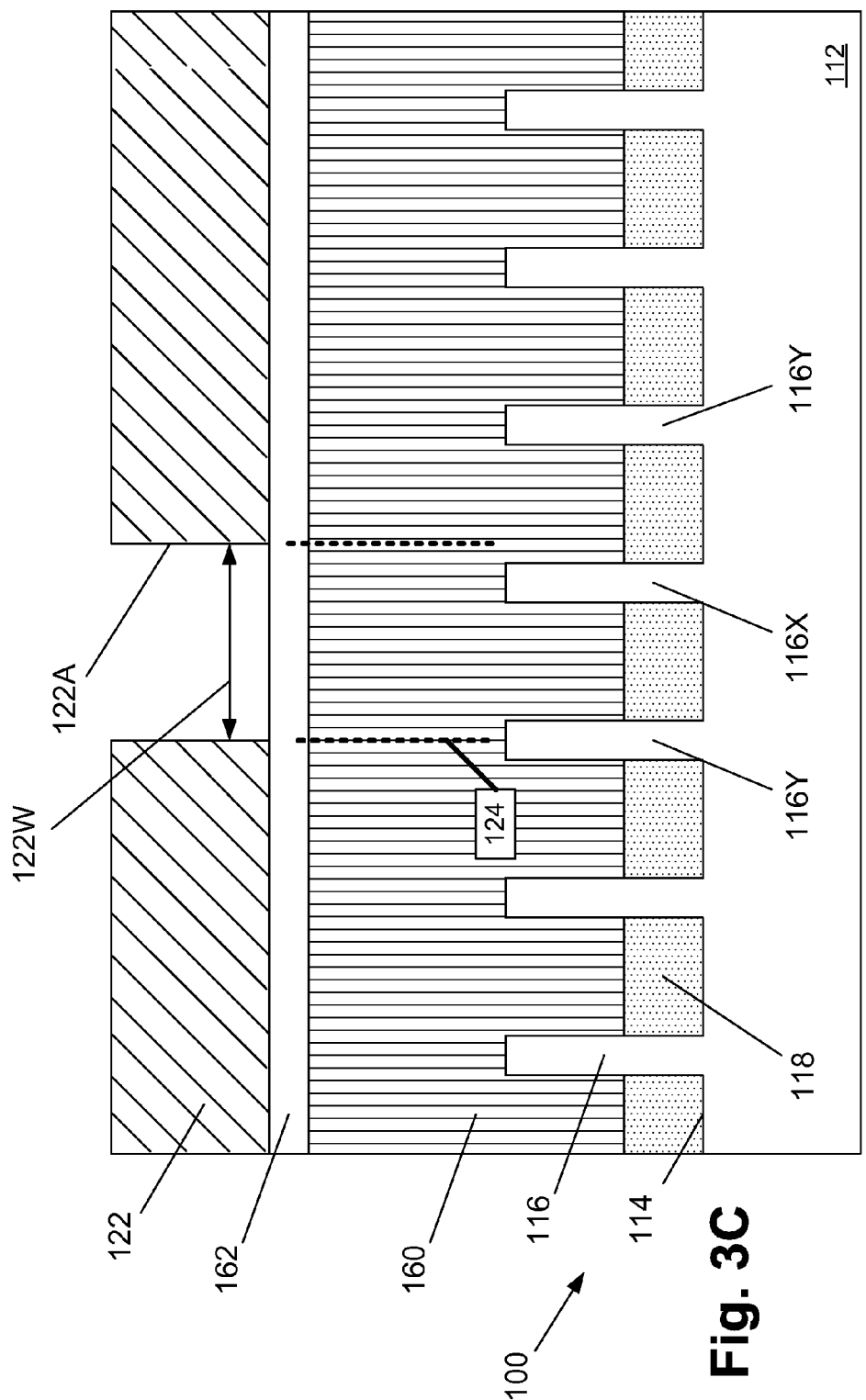

FIGS. 3A-3J depict another illustrative method disclosed herein for removing dummy fin structures when forming FinFET devices. FIG. 3A depicts the product at a point of fabrication that corresponds to that depicted in FIG. 2A, i.e., after the fins 116 have been formed and after the layer of insulating material 118 has been deposited and planarized.

FIG. 3B depicts the device 100 after a recess etching process was performed on the layer of insulating material 118 so as to recess its upper surface 118S to a desired recessed level. The etching process is selective relative to the fins 116. In one illustrative example, the recessed surface 118S of the layer of insulating material 118 will effectively define the final fin height for the fins 116 in the completed devices.

FIG. 3C schematically depicts the integrated circuit product 100 at a point in fabrication wherein several process operations have been performed. At this point, the device 100 is comprised of an illustrative dummy fin 116X that has been identified for removal and a plurality of device fins 116Y that will be part of the final device 100. In the depicted example, only a single fin 116X will be removed. However, as noted above, the novel methods disclosed herein may be employed to remove any desired number of dummy fins 116X. Also depicted in FIG. 3C is an illustrative masking layer 160, an anti-reflective coating layer 162 and the above-described patterned etch mask 122. The masking layer 160 may be comprised of a material having the capability of filling the very tight spaces between the fins 116. In one illustrative embodiment, the masking layer 160 may be comprised of a material such as OPL, spin-on carbon or amorphous carbon, and it may be formed by performing a spin coating/curing process. The anti-reflective coating layer 162 may be comprised of a material such as, for example, a silicon-containing material, and it may be formed by any traditional deposition process. The patterned etch mask 122 has the above-described opening 122A with the width 122W. As before, in the depicted example, the opening 122A in the patterned etch mask 122 is misaligned relative to the dummy fin 116X to be removed, as depicted by the dashed lines 124. That is, as positioned on the device 100, if an etching process were performed through the patterned etch mask 122, a portion of one of the device fins 116Y would also be removed.

Figure 3D:
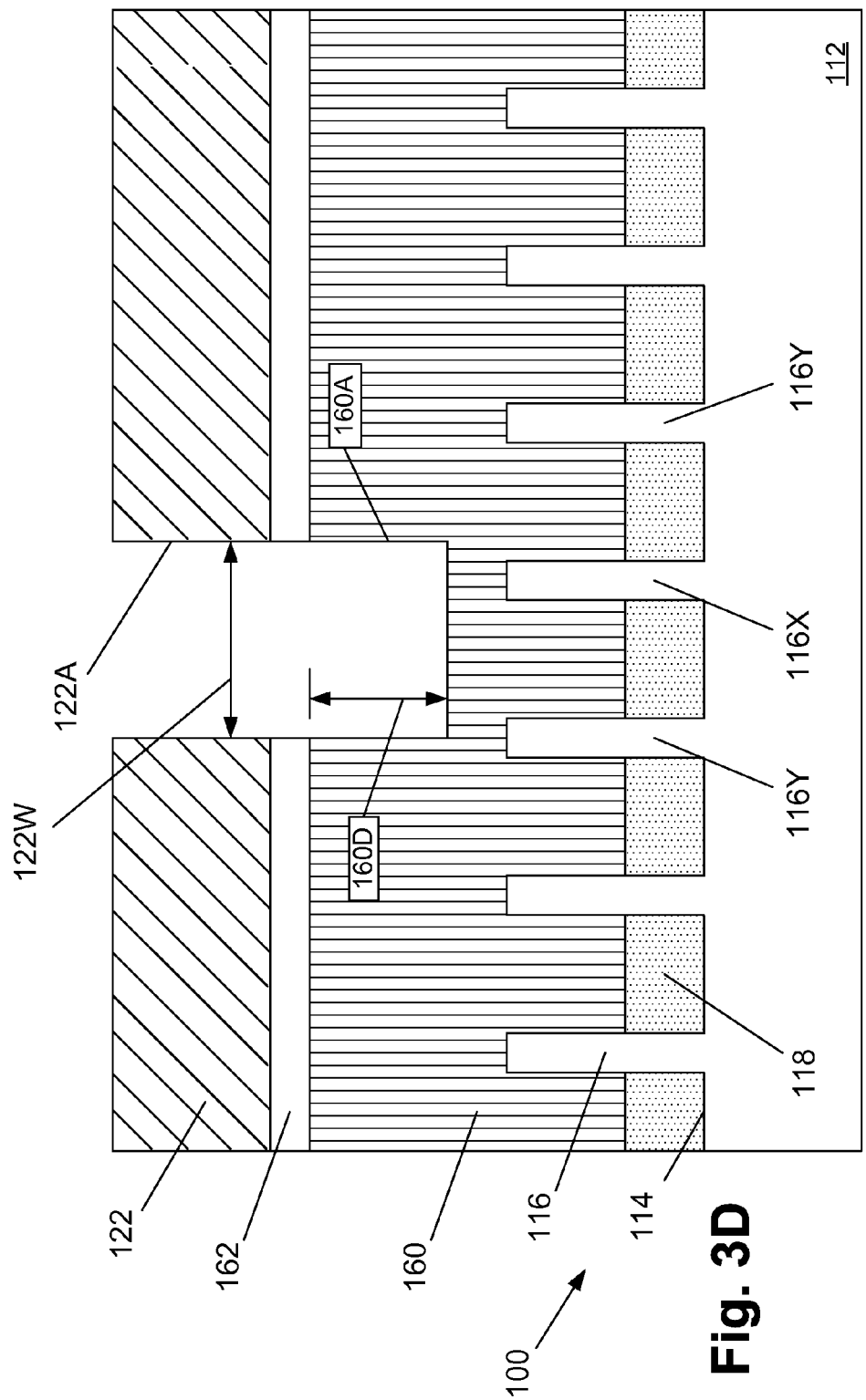

FIG. 3D depicts the product 100 after an etching process was performed through the opening 122A in the patterned etch mask 122 to define an opening in the anti-reflective coating layer 162 and, after a timed anisotropic etching process was performed, to define a recess 160A in the masking layer 160. In some applications, a single timed etching process may be performed to form the opening in the anti-reflective coating layer 162 and the recess 160A. The depth 160D of the recess 160A is less than the overall thickness of the masking layer 160. The depth 160D of the recess 160A may vary depending upon the particular application. In one example, the depth 160D may be such that the bottom of the recess 160A is positioned about 10 nm above the top of the fins 116.

Figure 3E:
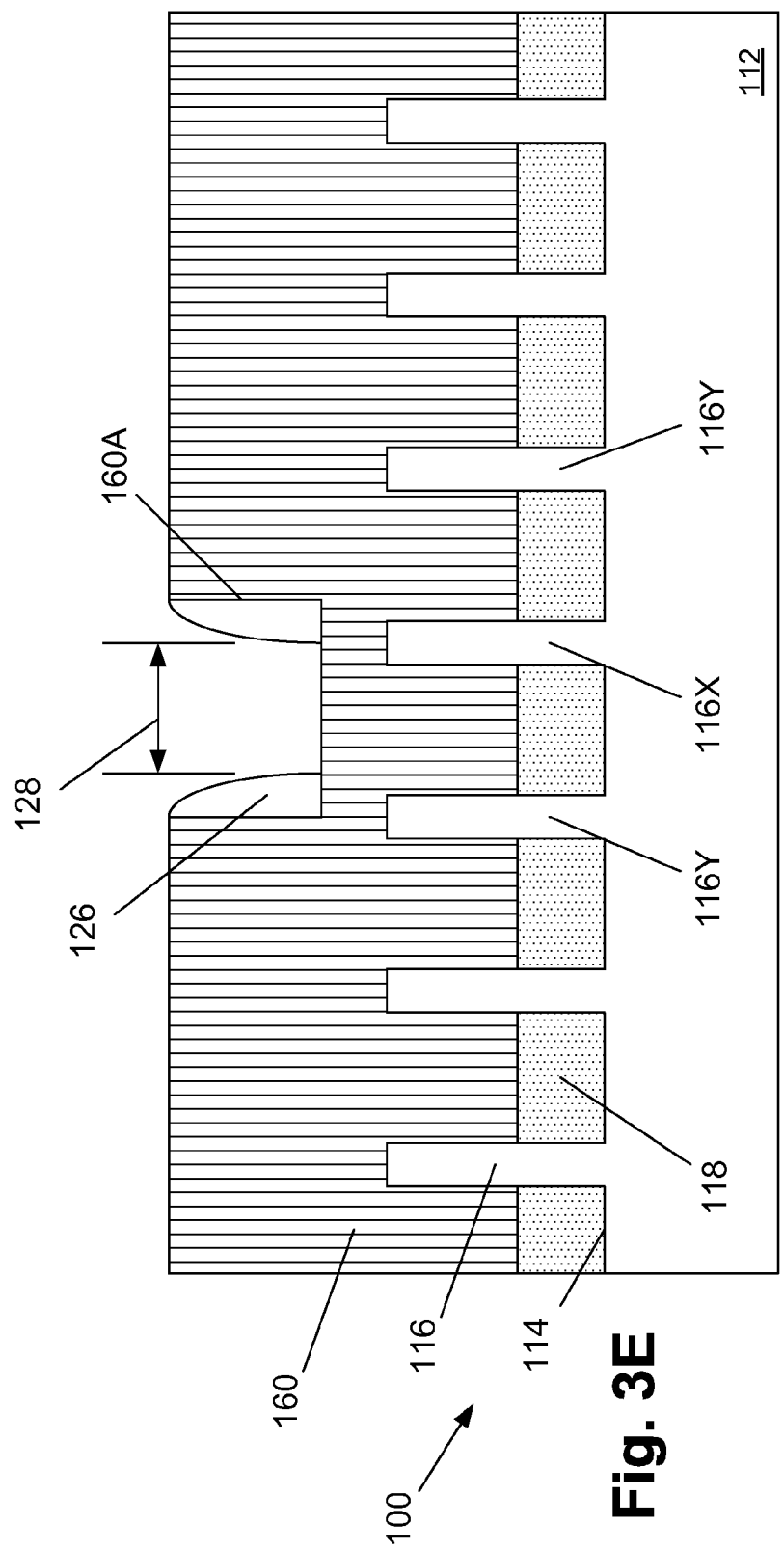

FIG. 3E depicts the device 100 after the patterned etch mask 122 has been removed and after the above-described internal sidewall spacer 126 has been formed in the recess 160A. As before, the spacer 126 defines a spacer opening 128, the width of which may vary depending upon the particular application, and the spacer 126 should have a sufficient base width such that it covers the underlying device fin 116Y that would otherwise be etched if an etching process were to be performed through an opening corresponding in size to the width of the recess 160A.

Figure 3F:
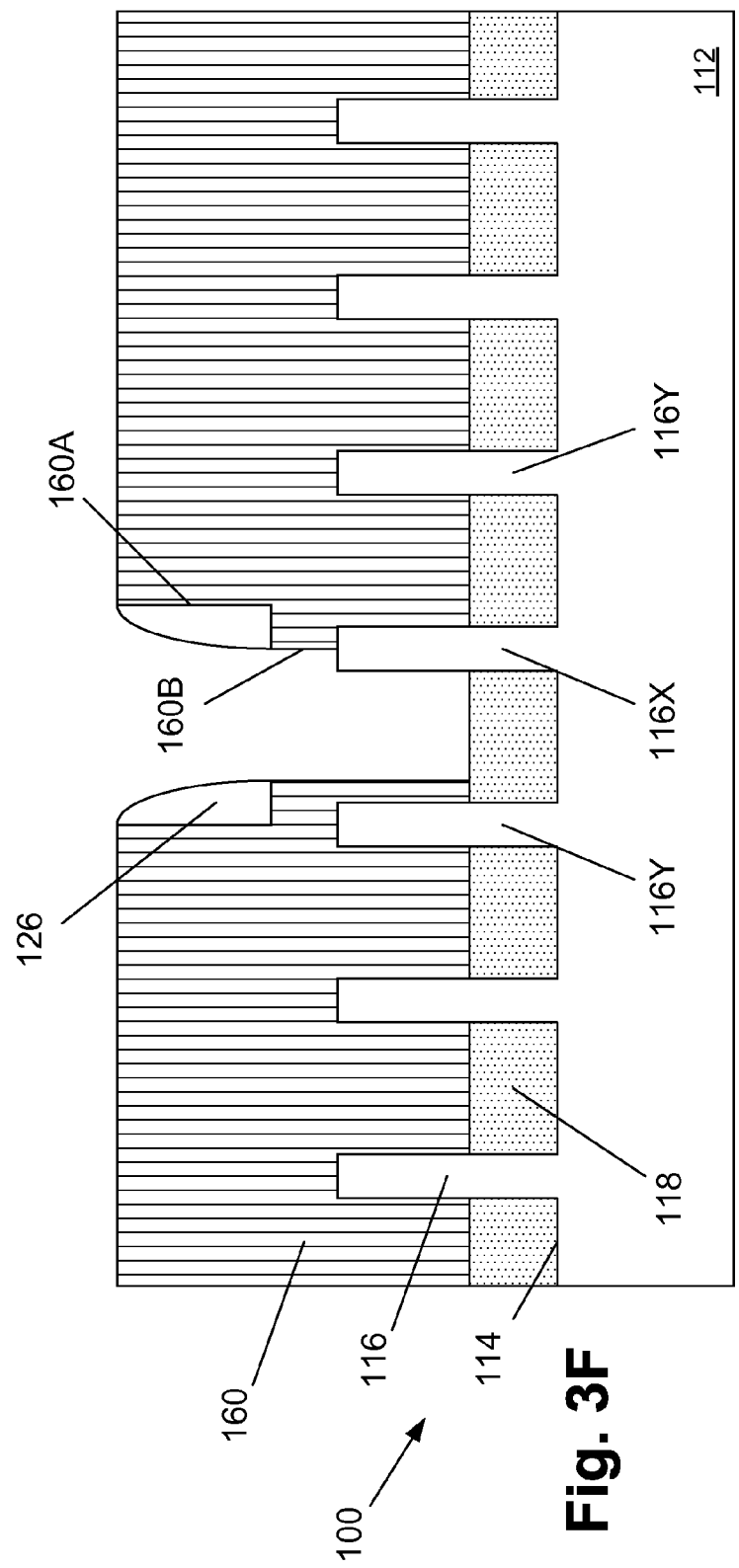

FIG. 3F depicts the product 100 after an etching process, such as an anisotropic etching process, has been performed on the masking layer 160 through the spacer opening 128 defined by the spacer 126. This etching process results in the definition of a reduced size opening 160B in the masking layer 160 that is smaller than the width of the recess 160A. The reduced size opening 160B exposes a portion of the layer of insulating material 118 and at least a portion of the dummy fin 116X for further processing.

Figure 3G:
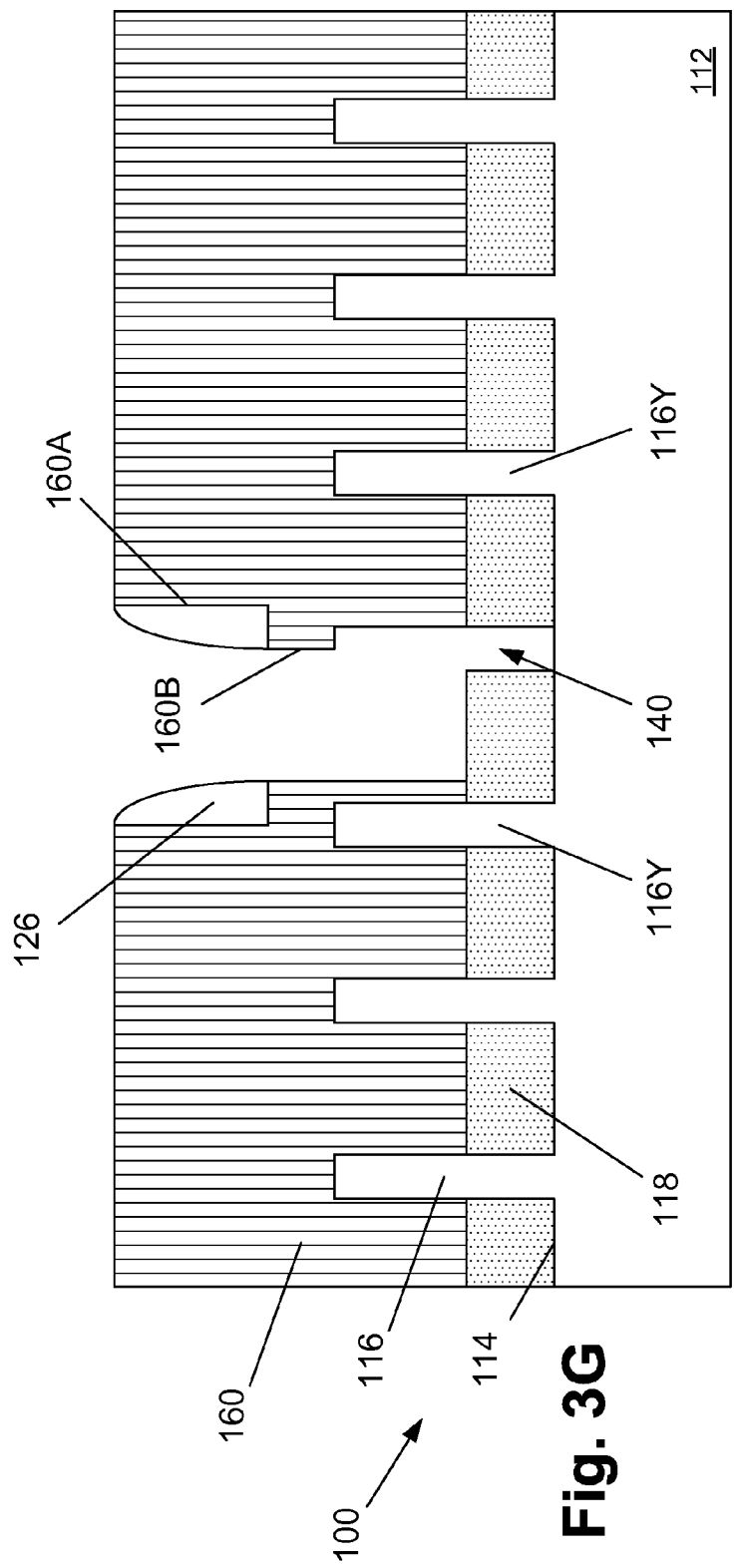

FIG. 3G depicts the product 100 after an etching process, such as a timed, isotropic etching process, has been performed through the reduced size opening 160B in the masking layer 160 on the exposed portion of the dummy fin 116X (FIG. 3F). This isotropic etching process effectively removes the dummy fin 116X and results in the formation of an opening or recess 140 within the layer of insulating material 118. To the extent this etching process removes any of the underlying substrate 112 positioned under the dummy fin 116X, such etching of the substrate 112 is not depicted in FIG. 3G.

FIG. 3H depicts the product after the masking layer 160 and the spacer 126 have been removed from the device 100. These materials may be removed by performing one or more etching or solvent-based cleaning processes.

FIG. 3I depicts the product 100 after the above-described replacement material 132 has been formed in the opening 140 formed in the layer of insulating material 118. In this embodiment, the replacement material 132 may be formed by depositing a layer of the desired material above the device 100 so as to over-fill the opening 140. Thereafter, an etch-back process may be performed to remove excess material positioned outside of the opening 140 to thereby result in the replacement material 132 depicted in FIG. 3I. In this embodiment, the upper surface 132S of the replacement material 132 is substantially level with the recessed surface 118S of the layer of insulating material 118.

Figure 3J:
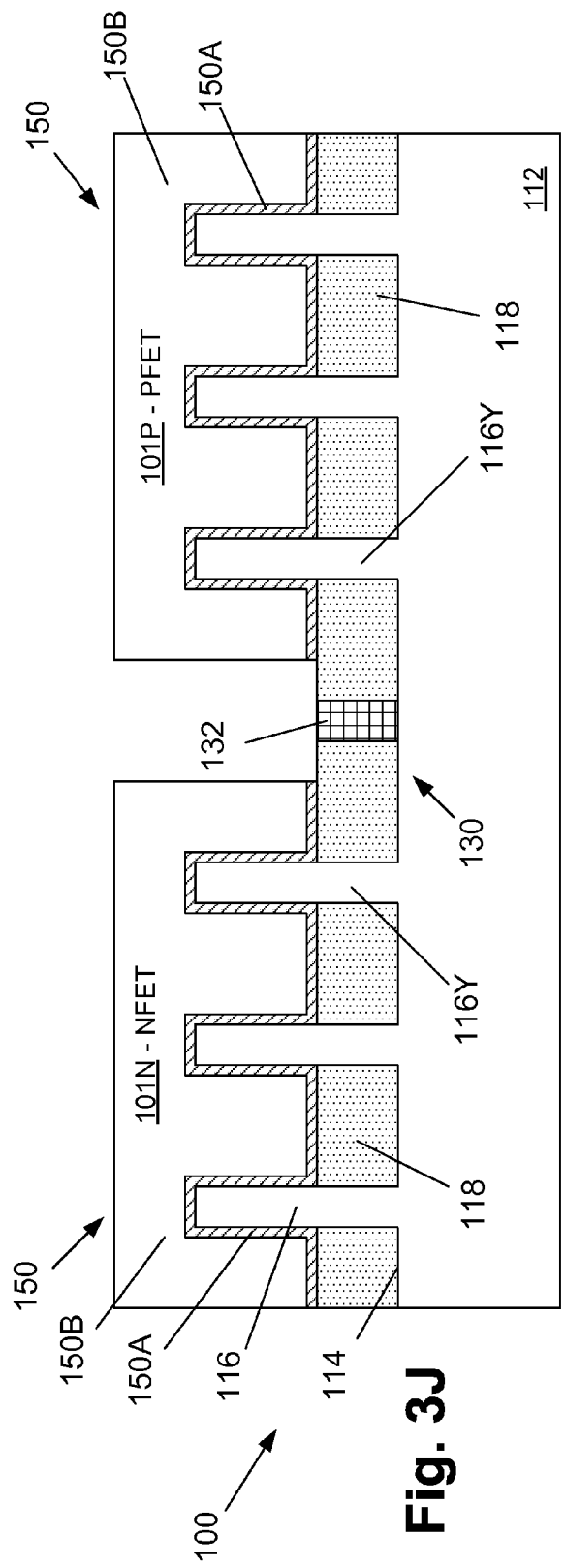

FIG. 3J depicts the product 100 after the above-described gate structures 150 were formed on the N-type FinFET device 101N and the P-type FinFET device 101P.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a plurality of fin-formation trenches in a semiconductor substrate, said fin-formation trenches defining a plurality of spaced-apart fins, wherein said plurality of spaced-apart fins are comprised of at least one dummy fin;
    forming a layer of insulating material that fills at least a portion of said fin-formation trenches;
    forming a masking layer above said layer of insulating material;
    forming a recess in said masking layer, wherein said recess has a depth that is less than a thickness of said masking layer;
    forming a sidewall spacer on sidewalls of said recess in said masking layer, said sidewall spacer defining a spacer opening;
    performing at least one first etching process on said masking layer through said spacer opening to define an opening in said masking layer that exposes a portion of said layer of insulating material and at least a portion of said at least one dummy fin; and
    performing at least one second etching process to remove at least a portion of said at least one dummy fin and thereby define an opening in said layer of insulating material.

2. The method of claim 1, further comprising forming a replacement material in said opening in said layer of insulating material.

3. The method of claim 2, wherein forming said replacement material comprises depositing a layer of said replacement material in at least said opening in said layer of insulating material and performing one of a chemical mechanical polishing process or an etch-back process on said layer of said replacement material.

4. The method of claim 1, wherein said layer of insulating material substantially fills said fin-formation trenches and said layer of insulating material has an upper surface that is substantially planar with an upper surface of each of said plurality of spaced-apart fins.

5. The method of claim 4, wherein said masking layer is formed above said upper surface of said layer of insulating material and above said upper surfaces of said plurality of spaced-apart fins.

6. The method of claim 1, wherein said layer of insulating material fills less than an entire depth of said fin-formation trenches and said layer of insulating material has an upper surface that is below an upper surface of each of said plurality of spaced-apart fins.

7. The method of claim 6, wherein said masking layer is formed above said upper surface of said layer of insulating material and wherein portions of said masking layer are positioned within said fin-formation trenches.

8. The method of claim 2, wherein said replacement material is comprised of an insulating material.

9. A method, comprising:
    forming a plurality of fin-formation trenches in a semiconductor substrate, said fin-formation trenches defining a plurality of spaced-apart fins, wherein said plurality of spaced-apart fins are comprised of at least one dummy fin;
    forming a layer of insulating material that fills at least a portion of said fin-formation trenches;
    forming a masking layer above said layer of insulating material;
    forming a patterned etch mask above said masking layer, said patterned etch mask being comprised of at least one opening;
    performing at least one first etching process through said patterned etch mask on said masking layer to define a recess in said masking layer, wherein said recess has a depth that is less than a thickness of said masking layer;
    removing said patterned etch mask;
    forming a sidewall spacer on sidewalls of said recess in said masking layer, said sidewall spacer defining a spacer opening;
    performing at least one second etching process on said masking layer through said spacer opening to define an opening in said masking layer that exposes a portion of said layer of insulating material and at least a portion of said at least one dummy fin; and performing at least one third etching process to remove at least a portion of said at least one dummy fin and thereby define an opening in said layer of insulating material.

10. The method of claim 9, further comprising forming a replacement material in said opening in said layer of insulating material.

11. The method of claim 10, wherein forming said replacement material comprises depositing a layer of said replacement material in at least said opening in said layer of insulating material and performing one of a chemical mechanical polishing process or an etch-back process on said layer of said replacement material.

12. The method of claim 9, wherein said layer of insulating material substantially fills said fin-formation trenches and said layer of insulating material has an upper surface that is substantially planar with an upper surface of each of said plurality of spaced-apart fins.

13. The method of claim 12, wherein said masking layer is formed above said upper surface of said layer of insulating material and above said upper surfaces of said plurality of spaced-apart fins.

14. The method of claim 9, wherein said layer of insulating material fills less than an entire depth of said fin-formation trenches and said layer of insulating material has an upper surface that is below an upper surface of each of said plurality of spaced-apart fins.

15. The method of claim 14, wherein said masking layer is formed above said upper surface of said layer of insulating material and wherein portions of said masking layer are positioned within said fin-formation trenches.

16. A method, comprising:
forming a plurality of fin-formation trenches in a semiconductor substrate, said fin-formation trenches defining a plurality of spaced-apart fins, said plurality of fins being comprised of a plurality of device fins and at least one dummy fin;

forming a layer of insulating material that fills said fin-formation trenches, said layer of insulating material having an upper surface that is substantially planar with an upper surface of each of said plurality of spaced-apart fins;

forming a masking layer above said layer of insulating material and said upper surfaces of said plurality of spaced-apart fins;

forming a recess in said masking layer, wherein said recess has a depth that is less than a thickness of said masking layer;

forming a sidewall spacer on sidewalls of said recess in said masking layer, said sidewall spacer defining a spacer opening;

performing at least one first etching process on said masking layer through said spacer opening to define an opening in said masking layer that exposes a portion of said layer of insulating material and at least a portion of said at least one dummy fin;

performing at least one second etching process to remove at least a portion of said at least one dummy fin and thereby define an opening in said layer of insulating material;

removing said masking layer;

forming a replacement material in said opening in said layer of insulating material, and performing at least one process operation to recess said upper surface of said layer of insulating material to a desired recessed level so as to thereby expose a portion of said plurality of device fins and a portion of said replacement material.

17. The method of claim 16, wherein forming said replacement material comprises depositing a layer of said replacement material in at least said opening in said layer of insulating material and performing a chemical mechanical polishing process on said layer of said replacement material.

18. The method of claim 16, further comprising forming at least one gate structure around at least a portion of at least one of said device fins.

19. The method of claim 16, wherein said replacement material has an upper surface that is positioned above said recessed level of said layer of insulating material.

20. A method, comprising:
forming a plurality of fin-formation trenches in a semiconductor substrate, said fin-formation trenches defining a plurality of spaced-apart fins, said plurality of spaced-apart fins being comprised of a plurality of device fins and at least one dummy fin;

forming a layer of insulating material that is less than an entire depth of said fin-formation trenches, wherein said layer of insulating material has an upper surface that is below an upper surface of each of said plurality of spaced-apart fins;

forming a masking layer above said layer of insulating material and said upper surfaces of said plurality of spaced apart fins, wherein portions of said masking layer are positioned within said fin-formation trenches;

forming a recess in said masking layer, wherein said recess has a depth that is less than a thickness of said masking layer;

forming a sidewall spacer on sidewalls of said recess in said masking layer, said sidewall spacer defining a spacer opening;

performing at least one first etching process on said masking layer through said spacer opening to define an opening in said masking layer that exposes a portion of said layer of insulating material and at least a portion of said at least one dummy fin;

performing at least one second etching process to remove at least a portion of said at least one dummy fin and thereby define an opening in said layer of insulating material;

removing said masking layer; and forming a replacement material in said opening in said layer of insulating material.

21. The method of claim 20, wherein forming said replacement material comprises depositing a layer of said replacement material in at least said opening in said layer of insulating material and performing an etch-back process on said layer of said replacement material.

22. The method of claim 20, further comprising forming at least one gate structure around at least a portion of at least one of said device fins.

23. The method of claim 20, wherein said replacement material has an upper surface that is substantially level with said upper surface of said layer of insulating material.

* * * * *